US012436472B2

United States Patent
Van De Kerkhof et al.

(10) Patent No.: US 12,436,472 B2
(45) Date of Patent: Oct. 7, 2025

(54) COOLING HOOD FOR RETICLE

(71) Applicant: ASML Netherlands B.V., Veldhoven (NL)

(72) Inventors: Marcus Adrianus Van De Kerkhof, Helmond (NL); Victor Antonio Perez-Falcon, Golden, CO (US)

(73) Assignee: ASML Netherlands B.V., Veldhoven (NL)

( * ) Notice: Subject to any disclaimer, the term of this patent is extended or adjusted under 35 U.S.C. 154(b) by 119 days.

(21) Appl. No.: 18/570,242

(22) PCT Filed: May 27, 2022

(86) PCT No.: PCT/EP2022/064478
§ 371 (c)(1),
(2) Date: Dec. 14, 2023

(87) PCT Pub. No.: WO2022/263148
PCT Pub. Date: Dec. 22, 2022

(65) Prior Publication Data
US 2024/0288783 A1    Aug. 29, 2024

Related U.S. Application Data

(60) Provisional application No. 63/210,394, filed on Jun. 14, 2021.

(51) Int. Cl.
*G03F 7/00* (2006.01)
(52) U.S. Cl.
CPC ...... *G03F 7/70875* (2013.01); *G03F 7/70358* (2013.01)
(58) Field of Classification Search
CPC .................. G03F 7/70875; G03F 7/70358
See application file for complete search history.

(56) References Cited

U.S. PATENT DOCUMENTS 6,445,439 B1   9/2002  McCullough
6,952,253 B2   10/2005 Lof et al.
(Continued)

FOREIGN PATENT DOCUMENTS

DE    102011086513 A1   5/2013
JP    2010-080855 A     4/2010
(Continued)

OTHER PUBLICATIONS

International Search Report and Written Opinion of the International Searching Authority directed to International Patent Application No. PCT/EP2022/064478, mailed Oct. 11, 2022; 11 pages.
(Continued)

*Primary Examiner* — Hung V Nguyen
(74) *Attorney, Agent, or Firm* — Sterne, Kessler, Goldstein &Fox P.L.L.C.

(57) ABSTRACT

Systems, apparatuses, and methods are provided for removing heat from a reticle. An example method can include generating, by a cooling controller, a cooling control signal based on timing data for a projection of a patterned radiation beam formed by illuminating an exposed area on a reticle supported by a reticle table, absorption data for the exposed area, and a target heat transfer rate. The cooling control signal can instruct a reticle cooling apparatus to actuate actuators to modify a distance between the reticle and a roof of the reticle cooling apparatus. The method can further include modifying, by the actuators based on the cooling control signal, the distance between the reticle and the roof to modify a heat transfer rate associated with a removal of heat from the reticle towards the target heat transfer rate.

15 Claims, 14 Drawing Sheets

(56) References Cited

U.S. PATENT DOCUMENTS

| | | | |
|---|---|---|---|
| 7,511,799 B2 | 3/2009 | Tel et al. | |
| 9,513,568 B2 * | 12/2016 | Westerlaken | G03F 7/70916 |
| 9,885,964 B2 * | 2/2018 | Westerlaken | G03F 7/70875 |
| 10,416,574 B2 | 9/2019 | Koevoets et al. | |
| 10,747,127 B2 | 8/2020 | Van Der Meulen et al. | |
| 2009/0207394 A1 | 8/2009 | Shibazaki | |
| 2013/0107236 A1 * | 5/2013 | Westerlaken | G03F 7/70875 |
| | | | 355/30 |
| 2015/0168854 A1 | 6/2015 | Westerlaken et al. | |
| 2019/0227445 A1 | 7/2019 | Van Der Meulen et al. | |

FOREIGN PATENT DOCUMENTS

| | | | |
|---|---|---|---|
| JP | 2012-004157 A | 1/2012 | |
| JP | 2013-254113 A | 12/2013 | |

OTHER PUBLICATIONS

"Reticle Cooling: Impinging Coolant Flow Switched to Follow Reticle Motion," Research Disclosure Statement No. 616002, Jun. 24, 2015; 5 pages.

* cited by examiner

COOLING HOOD FOR RETICLE

CROSS-REFERENCE TO RELATED APPLICATIONS

This application claims priority of U.S. Provisional Patent Application No. 63/210,394, which was filed on Jun. 14, 2021, and which is incorporated herein in its entirety by reference.

TECHNICAL FIELD

The present disclosure relates to lithographic apparatuses and, more particularly, to removing heat from reticles used in lithographic apparatuses.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

A radiation beam used to project a pattern disposed on a reticle onto a substrate will deliver a substantial amount of heat to the reticle. Localized expansion of the reticle caused by the heating may reduce the accuracy with which a projected pattern overlies patterns already present on the substrate.

SUMMARY

The present disclosure describes various aspects of systems, apparatuses, and methods for removing heat from a reticle during the operation of a lithographic apparatus to increase the accuracy with which a projected pattern overlies patterns already present on a substrate.

In some aspects, the present disclosure describes a lithographic apparatus. The lithographic apparatus can include an optical system configured to direct a radiation beam onto a reticle supported by a reticle table to form a patterned radiation beam. The radiation beam can cause heating of an exposed area of the reticle. The lithographic apparatus can further include a reticle cooling apparatus configured to remove heat from the reticle. The reticle cooling apparatus can include a cooling element disposed below the reticle and adjacent to the exposed area. The cooling element can include a body that includes a chamber connected to a channel configured to deliver gas to the chamber. A roof of the chamber can be disposed adjacent to the reticle and can include openings configured to output the gas towards the reticle. The reticle cooling apparatus can further include actuators configured to modify a distance between the roof and the reticle. The reticle cooling apparatus can further include a cooling controller configured to generate a cooling control signal based on timing data for a projection of the patterned radiation beam, absorption data for the exposed area on the reticle, and a target heat transfer rate. The cooling control signal can be configured to instruct the reticle cooling apparatus to actuate the actuators to modify the distance between the roof and the reticle. The cooling controller can be further configured to transmit the cooling control signal to the actuators.

In some aspects, the present disclosure describes a reticle cooling apparatus. The reticle cooling apparatus can include a cooling element configured to be disposed below a reticle supported by the reticle table and adjacent to an exposed area of the reticle. The cooling element can include a body containing a chamber connected to a channel configured to deliver gas to the chamber. A roof of the chamber can be configured to be disposed adjacent to the reticle and can include openings configured to output the gas towards the reticle. The reticle cooling apparatus can further include actuators configured to modify a distance between the roof and the reticle. The reticle cooling apparatus can further include a cooling controller configured to generate a cooling control signal based on timing data for a projection of a patterned radiation beam generated by the reticle, absorption data for the exposed area on the reticle, and a target heat transfer rate. The cooling control signal can be configured to instruct the reticle cooling apparatus to actuate the actuators to modify the distance between the roof and the reticle. The cooling controller can be further configured to transmit the cooling control signal to the actuators.

In some aspects, the present disclosure describes a method for removing heat from a reticle. The method can include generating, by a cooling controller, a cooling control signal based on timing data for a projection of a patterned radiation beam formed by illuminating an exposed area on a reticle supported by a reticle table, absorption data for the exposed area, and a target heat transfer rate. The cooling control signal can instruct a reticle cooling apparatus to actuate actuators to modify a distance between the reticle and a roof of a chamber connected to a channel for delivering gas to the chamber. The channel can be disposed in a body of a cooling element of the reticle cooling apparatus. The method can further include transmitting, by the cooling controller, the cooling control signal to the actuators. The method can further include modifying, by the actuators based on the cooling control signal, the distance between the reticle and the roof to modify a heat transfer rate associated with a removal of heat from the reticle towards the target heat transfer rate.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
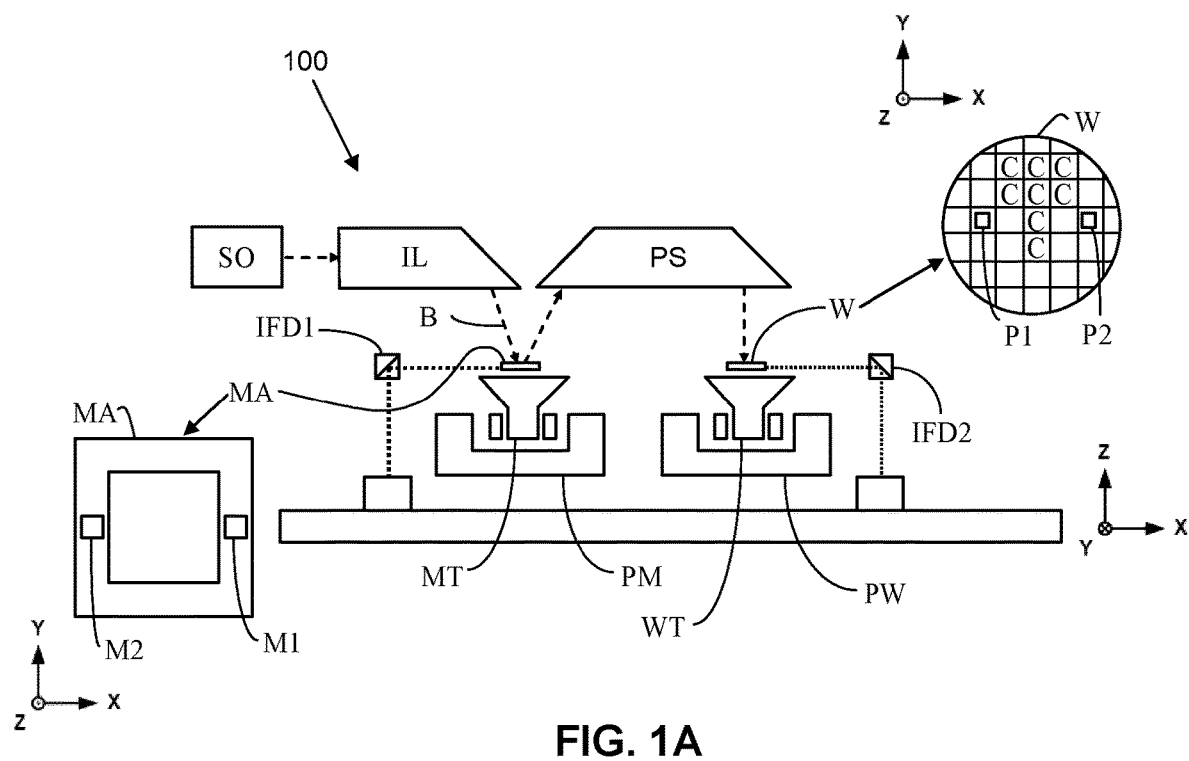
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

In one example, a reticle in an EUV scanner can be heated by an absorption of EUV radiation and cooled via the backside by a water-cooled reticle clamp. The absorption can be, for example, about 100 watts (W) for a source having a power greater than about 500 W. However, the indirect cooling provided by the water-cooled reticle table can be inefficient and require a water connection to the fast-moving reticle clamp, which can compromise mechatronic performance. Additionally, the thermal resistance of the thick reticle can result in a relatively slow cooling response and a first-wafer effect. Further, material non-uniformity can limit the effectiveness of feed-forward software corrections. Further still, the large thermal gradient through the reticle can limit the effectiveness of backside cooling by the reticle clamp.

In contrast, some aspects of the present disclosure can provide for reticle cooling hoods having a cooling plate with forced cold gas flow close to the reticle surface next to the EUV radiation beam in the scanning direction (e.g., the Y-direction). In some aspects, the scanning motion can result in dynamic heating (e.g., when in the EUV radiation beam) and cooling (e.g., when away from the beam over the cooling plate), which can be balanced to about 0 W by tuning the cooling parameters based on the EUV absorption (e.g., which can be derived from end user operational data or measured in-situ). In some aspects, the reticle cooling hoods described herein can be be located between the reticle and the reticle-masking (ReMa) Y-blades in a scanning EUV lithographic apparatus. In some aspects, the reticle cooling hoods described herein can operate at a separation distance of between about 50 micrometers and about 100 micrometers from the reticle surface using hydrogen gas (H2). In some aspects, the reticle cooling apparatuses described herein can also be referred to as "reticle cooling hoods."

In some aspects, the present disclosure provides for removing heat from a reticle by, as an initial operation, generating a cooling control signal based on timing data for a projection of a patterned radiation beam formed by illuminating an exposed area on a reticle supported by a reticle table, absorption data for the exposed area, and a target heat transfer rate. In some aspects, the present disclosure further provides for transmitting the cooling control signal to a reticle cooling hood to instruct the reticle cooling hood to actuate a set of actuators (e.g., one or more actuators) to modify a distance between the reticle and the reticle cooling hood. In some aspects, the present disclosure provides for modifying, by the set of actuators and based on the cooling control signal, the distance between the reticle and the reticle cooling hood to modify a heat transfer rate associated with a removal of heat from the reticle towards the target heat transfer rate.

In some aspects, the reticle cooling hoods described herein can incorporate any combination or sub-combination of the components, structures, features, and techniques described in: U.S. Pat. No. 10,747,127, issued Aug. 18, 2020, and titled "Lithographic apparatus"; U.S. Pat. No. 10,416,574, issued Sep. 17, 2019, and titled "Lithographic apparatus"; U.S. Pat. No. 6,445,439, issued Sep. 3, 2002, and titled "EUV reticle thermal management"; each of which is incorporated by reference herein in its entirety. In some aspects, the reticle cooling hoods described herein can have decreased complexity, and thus reduced cost and improved reliability, over the wafer cooling techniques described in one or more of these references because the motion of the reticle stage can be less complicated than the motion of the wafer stage (e.g., the reticle stage may only scan in the Y-direction, while the wafer stage may step in both the X-direction and the Y-direction) and the thermal requirements of the low thermal expansion material (LTEM) reticle substrate can be less stringent than the requirements of the wafer substrate. In addition, the reticle may not be coated with an outgassing resist, so the thermal conductive coupling can be more stable at this location, and H2 can be used with reduced influence from thermal accommodation coefficient (TAC) variations. Additionally or alternatively, the available volumes at the reticle level are larger the available volumes at the wafer level because many dimensions are about four times larger and there are less conflicting functions (e.g., there may little or no need for Z-mirrors and dynamic gas lock (DGL)).

In some aspects, the reticle cooling techniques described herein can also be achieved by shifting the zero crossing of the reticle material. However, this may require pre-heating the reticle to realize an overlay improvement together with updates to the reticle writing and qualification infrastructure to correct errors during reticle writing and qualification.

There are many exemplary aspects to the systems, apparatuses, methods, and computer program products disclosed herein. For example, the reticle cooling hoods described herein do not require active position control (e.g., reducing the complexity of the mechanical structure and volume considerations, even while such active position control is considered possible in practice). In some aspects, the substantial elimination of active position control can be positioned as either an overlay gain for higher source powers (e.g., greater than about 800 W), or as an opening to significantly reduce the complexity of the reticle stage by removing the water cooling lines from the dynamic interface to the fast-scanning stage. In some aspects, the substantial elimination of active position control can also extend the maximum scan speed and acceleration (e.g., in the positive and negative Y-direction) achievable for the reticle stage.

Before describing such aspects in more detail, however, it is instructive to present an example environment in which aspects of the present disclosure can be implemented.

Example Lithographic Systems

Figure 1B:
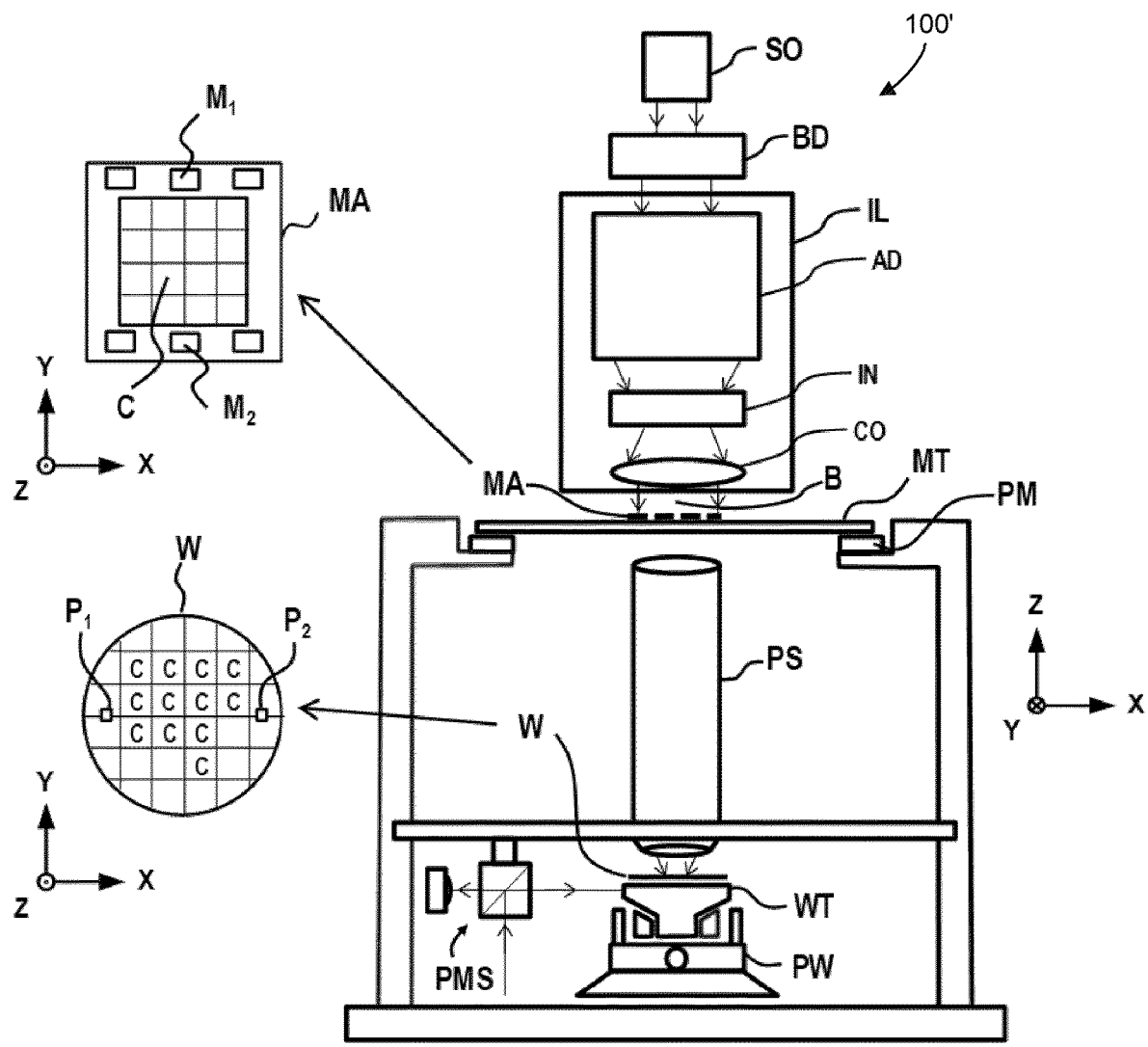
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table, a reticle table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables (e.g., two or more of substrate table WT) and/or two or more reticle tables (e.g., two or more of support structure MT). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS. Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a reticle table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Reflected light (e.g., zeroth-order diffracted beams) traverses the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first—and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan).

Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:
1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.
2. In scan mode, the support structure MT and the substrate table WT are scanned synchronously while a pattern imparted to the radiation beam B is projected onto a target portion C (e.g., a single dynamic exposure). The velocity and direction of the substrate table WT (e.g., wafer table) relative to the support structure MT (e.g., reticle table) can be determined by the (de-)magnification and image reversal characteristics of the projection system PS.
3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
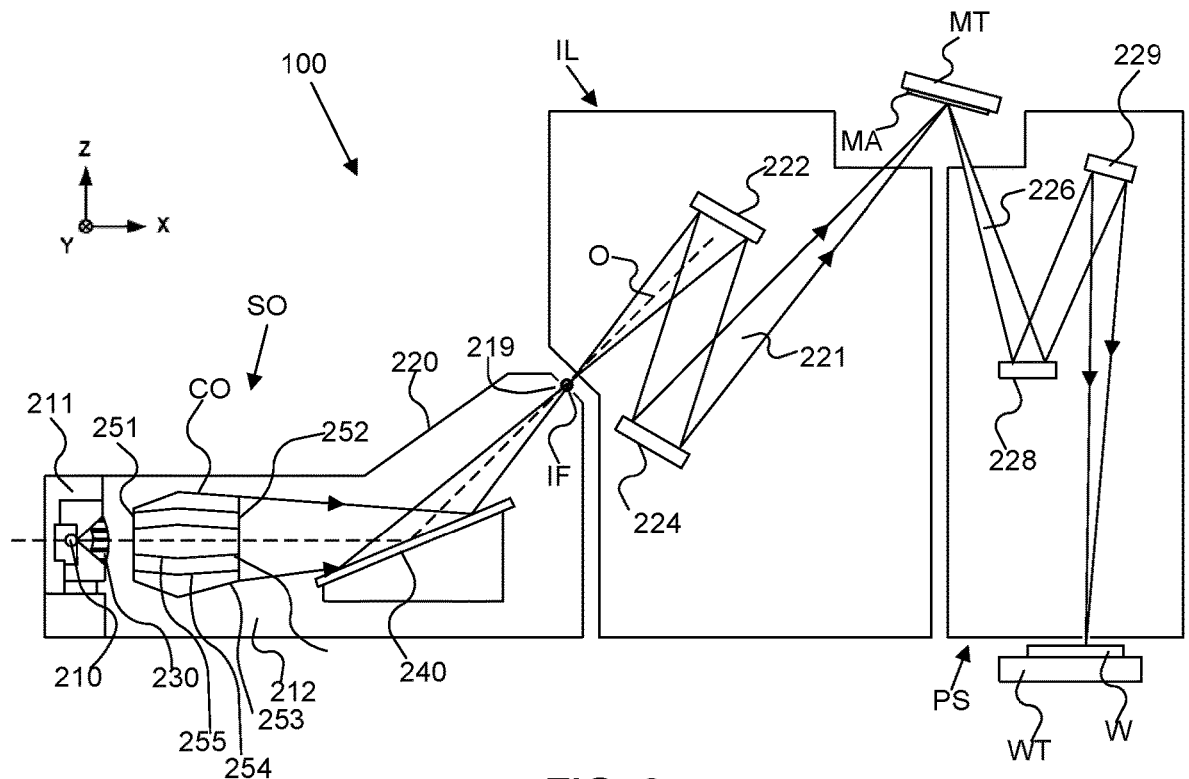
FIG. 2 is a more detailed schematic illustration of the reflective lithographic apparatus shown in FIG. 1A according to some aspects of the present disclosure.

FIG. 2 shows the lithographic apparatus 100 (or a modified architecture thereof) in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ-plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in the source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. The grating spectral filter 240 can be used to suppress infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
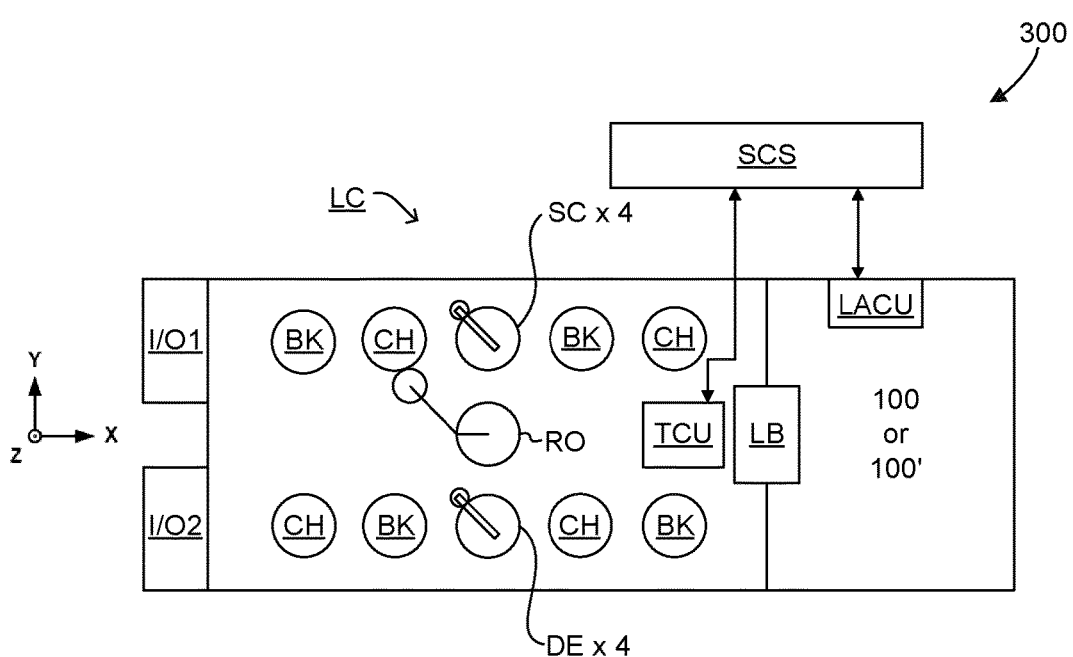
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre—and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Radiation Source

Figure 4:
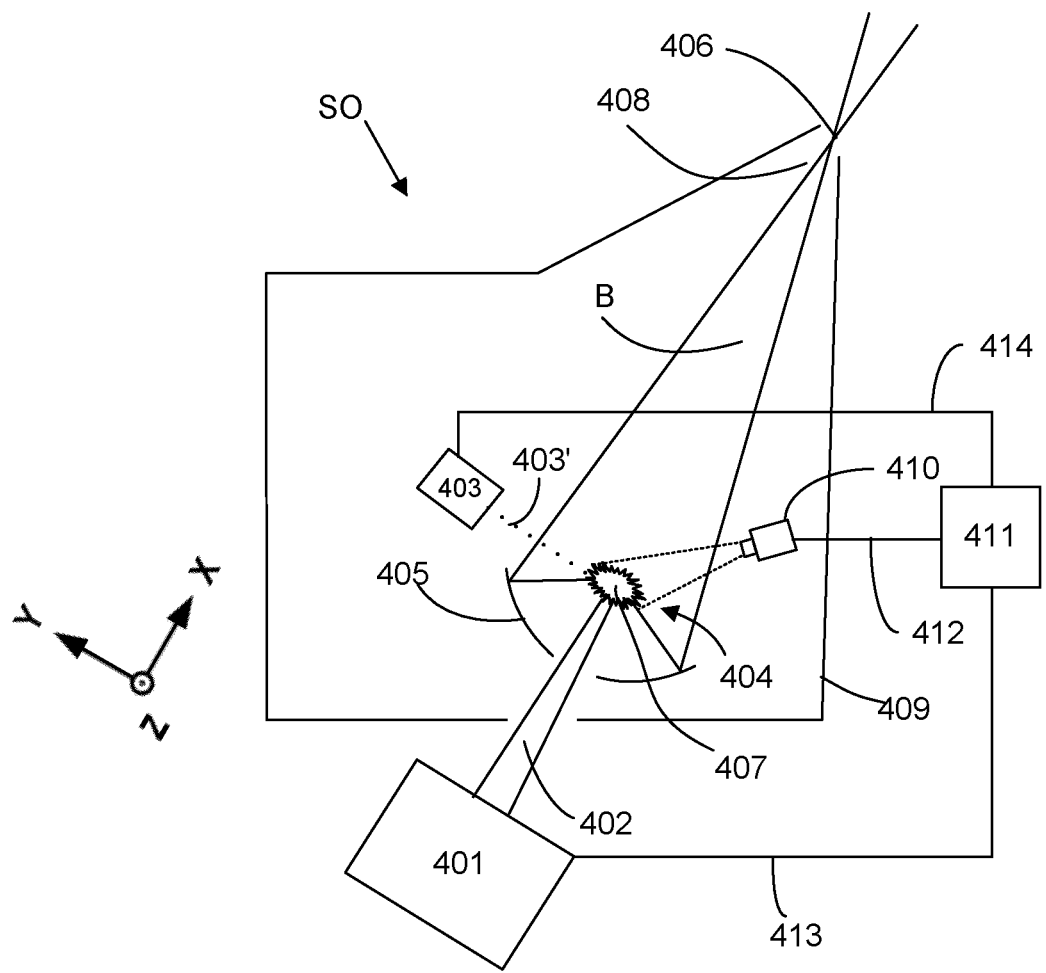
FIG. 4 is a schematic illustration of an example radiation source for an example reflective lithographic apparatus according to some aspects of the present disclosure.

An example of the radiation source SO for an example reflective lithographic apparatus (e.g., lithographic apparatus 100 of FIG. 1A) is shown in FIG. 4. As shown in FIG. 4, the radiation source SO is illustrated from a point of view (e.g., a top view) that is normal to the XY plane as described below.

The radiation source SO shown in FIG. 4 is of a type which can be referred to as a laser produced plasma (LPP) source. A laser system 401, which can for example include a carbon dioxide ($CO_2$) laser, is arranged to deposit energy via one or more laser beams 402 into fuel targets 403', such as one or more discrete tin (Sn) droplets, which are provided from a fuel target generator 403 (e.g., example, fuel emitter, droplet generator). According to some aspects, laser system 401 can be, or can operate in the fashion of, a pulsed, continuous wave or quasi-continuous wave laser. The trajectory of fuel targets 403' (e.g., example, droplets) emitted from the fuel target generator 403 can be parallel to an X-axis. According to some aspects, the one or more laser beams 402 propagate in a direction parallel to a Y-axis, which is perpendicular to the X-axis. A Z-axis is perpendicular to both the X-axis and the Y-axis and extends generally into (or out of) the plane of the page, but in other aspects, other configurations are used. In some embodiments, the laser beams 402 can propagate in a direction other than parallel to the Y-axis (e.g., in a direction other than orthogonal to the X-axis direction of the trajectory of the fuel targets 403').

In some aspects, the one or more laser beams 402 can include a pre-pulse laser beam and a main pulse laser beam. In such aspects, the laser system 401 can be configured to hit each of the fuel targets 403' with a pre-pulse laser beam to generate a modified fuel target. The laser system 401 can be further configured to hit each of the modified fuel targets with a main pulse laser beam to generate the plasma 407.

Although tin is referred to in the following description, any suitable target material can be used. The target material can for example be in liquid form, and can for example be a metal or alloy. Fuel target generator 403 can include a nozzle configured to direct tin, e.g., in the form of fuel targets 403' (e.g., discrete droplets) along a trajectory towards a plasma formation region 404. Throughout the remainder of the description, references to "fuel", "fuel target" or "fuel droplet" are to be understood as referring to the target material (e.g., droplets) emitted by fuel target generator 403. Fuel target generator 403 can include a fuel emitter. The one or more laser beams 402 are incident upon the target material (e.g., tin) at the plasma formation region 404. The deposition of laser energy into the target material 404 creates a plasma 407 at the plasma formation region 404. Radiation, including EUV radiation, is emitted from the plasma 407 during de-excitation and recombination of ions and electrons of the plasma.

The EUV radiation is collected and focused by a radiation collector 405 (e.g., radiation collector CO). In some aspects, radiation collector 405 can include a near normal-incidence radiation collector (sometimes referred to more generally as a normal-incidence radiation collector). The radiation collector 405 can be a multilayer structure, which is arranged to reflect EUV radiation (e.g., EUV radiation having a desired wavelength such as about 13.5 nm). According to some aspects, radiation collector 405 can have an ellipsoidal configuration, having two focal points. A first focal point can be at the plasma formation region 404, and a second focal point can be at an intermediate focus 406, as discussed herein.

In some aspects, laser system 401 can be located at a relatively long distance from the radiation source SO. Where this is the case, the one or more laser beams 402 can be passed from laser system 401 to the radiation source SO with the aid of a beam delivery system (not shown) including, for example, suitable directing mirrors and/or a beam expander, and/or other optics. Laser system 401 and the radiation source SO can together be considered to be a radiation system.

Radiation that is reflected by radiation collector 405 forms a radiation beam B. The radiation beam B is focused at a point (e.g., the intermediate focus 406) to form an image of plasma formation region 404, which acts as a virtual radiation source for the illumination system IL. The point at which the radiation beam B is focused can be referred to as the intermediate focus (IF) (e.g., intermediate focus 406). The radiation source SO is arranged such that the intermediate focus 406 is located at or near to an opening 408 in an enclosing structure 409 of the radiation source SO.

The radiation beam B passes from the radiation source SO into the illumination system IL, which is configured to condition the radiation beam B. The radiation beam B passes from the illumination system IL and is incident upon the patterning device MA held by the support structure MT. The patterning device MA reflects and patterns the radiation beam B. Following reflection from the patterning device MA the patterned radiation beam B enters the projection system PS. The projection system includes a plurality of mirrors, which are configured to project the radiation beam B onto a substrate W held by the substrate table WT. The projection system PS can apply a reduction factor to the radiation beam, forming an image with features that are smaller than corresponding features on the patterning device MA. For example, a reduction factor of four can be applied. Although the projection system PS is shown as having two mirrors in FIG. 2, the projection system can include any number of mirrors (e.g., six mirrors).

The radiation source SO can also include components which are not illustrated in FIG. 4. For example, a spectral filter can be provided in the radiation source SO. The spectral filter can be substantially transmissive for EUV radiation but substantially blocking for other wavelengths of radiation such as infrared radiation.

The radiation source SO (or radiation system) can further include a fuel target imaging system to obtain images of fuel targets (e.g., droplets) in the plasma formation region 404 or, more particularly, to obtain images of shadows of the fuel targets. The fuel target imaging system can detect light diffracted from the edges of the fuel targets. References to images of the fuel targets in the following text should be understood also to refer to images of shadows of the fuel targets or diffraction patterns caused by the fuel targets.

The fuel target imaging system can include a photodetector such as a CCD array or a CMOS sensor, but it will be appreciated that any imaging device suitable for obtaining images of the fuel targets can be used. It will be appreciated that the fuel target imaging system can include optical components, such as one or more lenses, in addition to a photodetector. For example, the fuel target imaging system can include a camera 410, e.g., a combination of a photosensor or photodetector and one or more lenses. The optical components can be selected so that the photosensor or camera 410 obtains near-field images and/or far-field images. The camera 410 can be positioned within the radiation source SO at any appropriate location from which the camera has a line of sight to the plasma formation region 404 and one or more markers (not shown in FIG. 4) provided on the radiation collector 405. In some aspects, however, it can be desirable to position the camera 410 away from the propagation path of the one or more laser beams 402 and from the trajectory of the fuel targets emitted from fuel target generator 403 so as to avoid damage to the camera 410. According to some aspects, the camera 410 is configured to provide images of the fuel targets to a controller 411 via a connection 412. The connection 412 is shown as a wired connection, though it will be appreciated that the connection 412 (and other connections referred to herein) can be implemented as either a wired connection or a wireless connection or a combination thereof.

As shown in FIG. 4, the radiation source SO can include a fuel target generator 403 configured to generate and emit fuel targets 403' (e.g., discrete tin droplets) towards a plasma formation region 404. The radiation source SO can further include a laser system 401 configured to hit one or more of the fuel targets 403' with one or more laser beams 402 for generating a plasma 407 at the plasma formation region 404. The radiation source SO can further include a radiation collector 405 (e.g., a radiation collector CO) configured to collect radiation emitted by the plasma 407.

Example Reticle Cooling Apparatuses

Example reticle cooling apparatuses for removing heat from a patterning device MA (e.g., a mask, a reticle, or a dynamic patterning device) positioned between an illumination system IL and a projection system PS in an example lithographic apparatus 100 or 100' are shown in FIGS. 5-10. In some aspects, the example reticle cooling apparatuses described with reference to FIGS. 5-10 can be included in, or associated with, an example lithographic apparatus, such as a scanning lithographic apparatus.

Figure 5A:
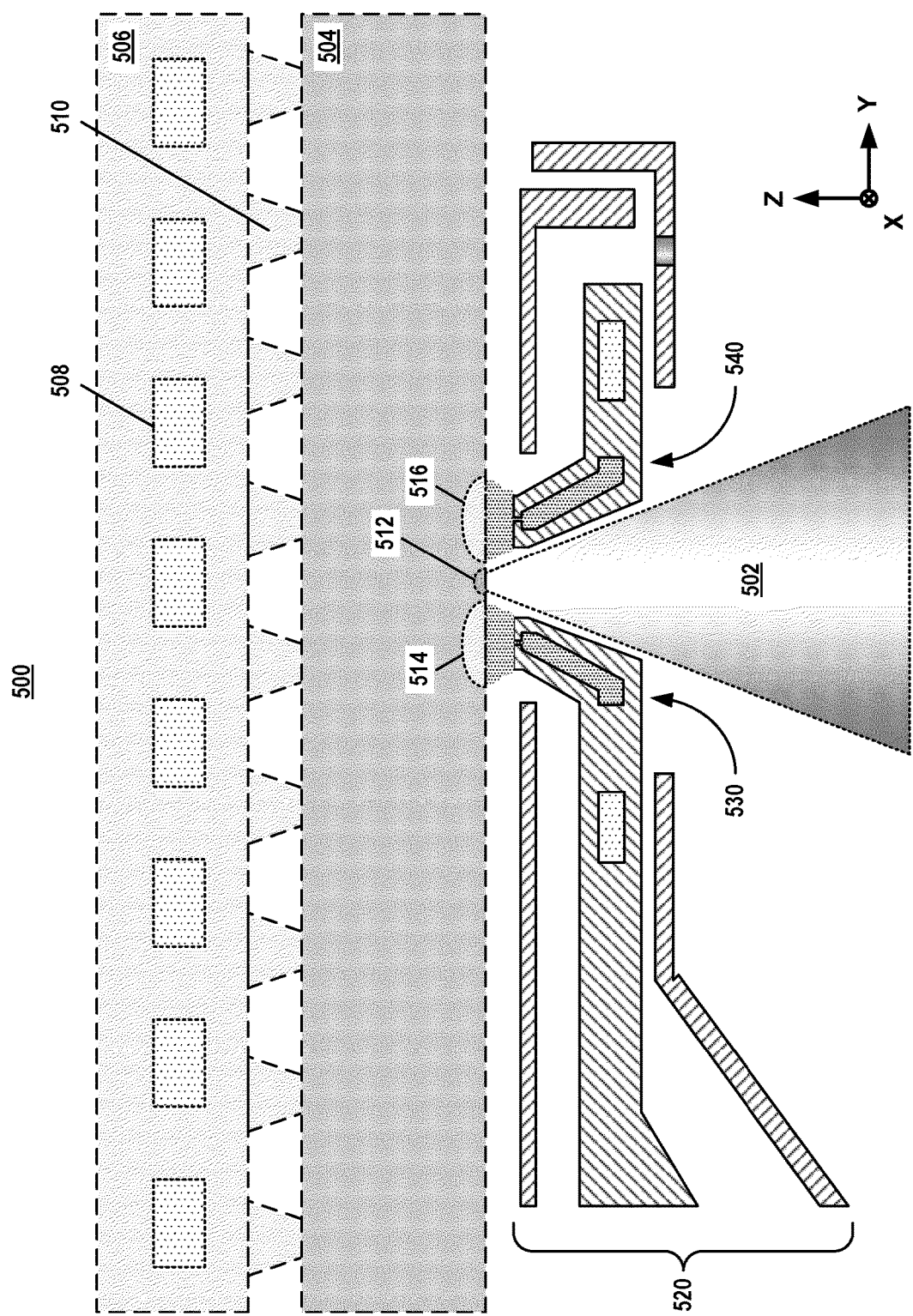
FIGS. 5A and 5B are a schematic illustrations of an example reticle cooling apparatus according to some aspects of the present disclosure.
Figure 5B:
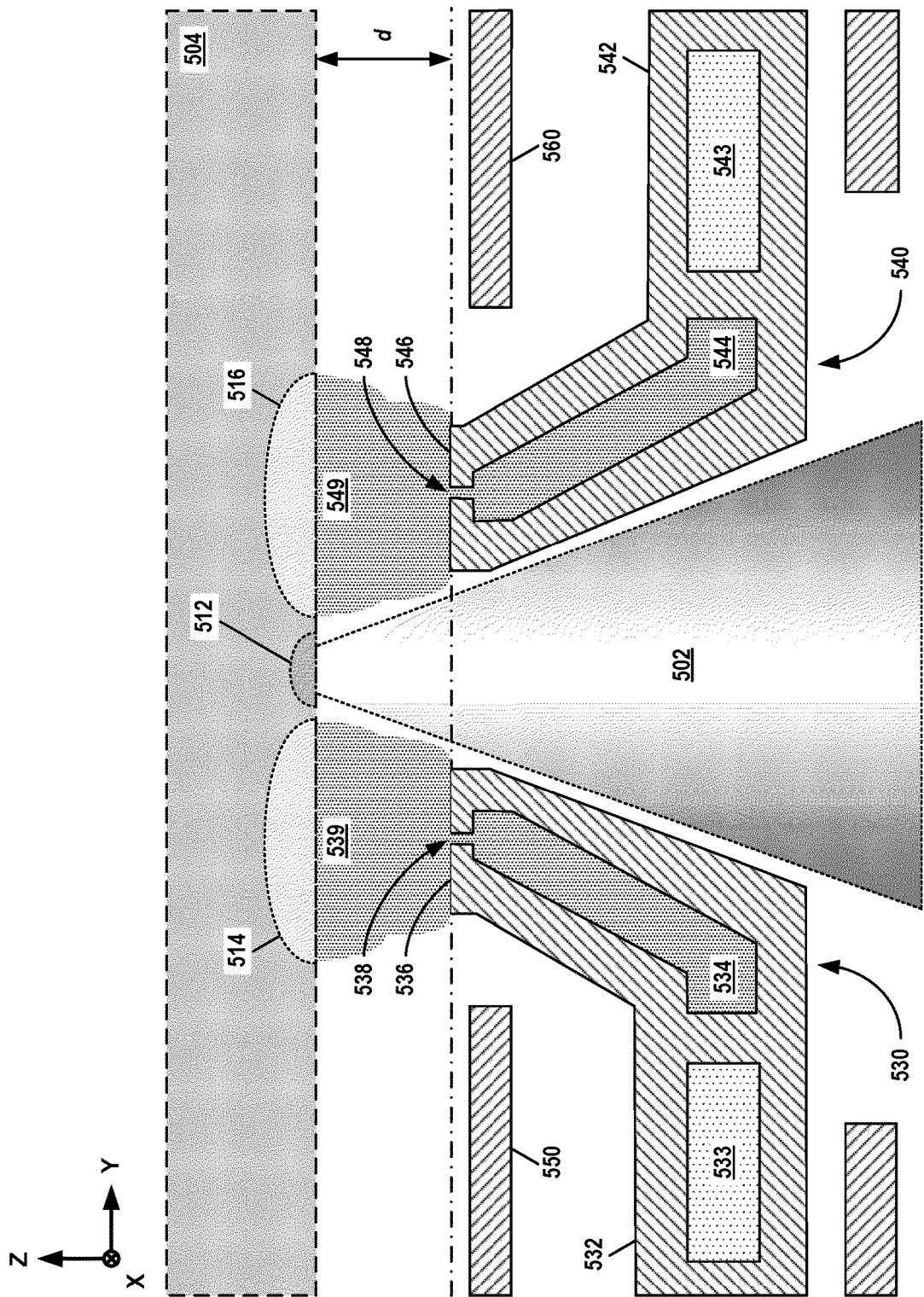

FIGS. 5A and 5B are schematic illustrations of portions of an example lithographic apparatus 500 according to some aspects of the present disclosure. As shown in FIG. 5A, the example lithographic apparatus 500 can include an optical system (not depicted) configured to direct a radiation beam 502 (e.g., an EUV radiation beam) onto a reticle 504 supported by a reticle table 506 (e.g., including a plurality of fluid cooling channels 508 and a plurality of burls 510) to form a patterned radiation beam. The radiation beam 502 can cause heating of an exposed area 512 of the reticle 504.

In some aspects, the example lithographic apparatus 500 can include a reticle cooling apparatus 520 configured to remove the heat from the reticle 504. For example, the reticle cooling apparatus 520 can be configured to remove heat from a first cooled area 514 disposed adjacent (e.g., in the negative Y-direction) to the exposed area 512 of the reticle 504. Additionally or alternatively, the reticle cooling apparatus 520 can be configured to remove heat from a second cooled area 516 disposed adjacent (e.g., in the positive Y-direction) to the exposed area 512 of the reticle 504.

In some aspects, the first cooled area 514, the second cooled area 516, or both can be located within about 3 cm or less from a line that bisects the exposed area 512. In some aspects, the first cooled area 514, the second cooled area 516, or both can be located within about 2 cm or less from an edge of the exposed area 512. In some aspects, the reticle cooling apparatus 520 can include a cooling element configured to be disposed below the reticle 504 and adjacent to the exposed area 512. In some aspects, the cooling element can be in thermal communication with the reticle 504. In some aspects, the cooling element can be separated from the exposed area 512 in a direction that corresponds to a scanning direction of the example lithographic apparatus 500. In some aspects, a distance d between an upper surface (e.g., first roof 536, second roof 546) of the cooling element and a lower surface of the reticle 504 can be less than about 1 mm. In some aspects, the distance d can be between about 50 micrometers and about 100 micrometers.

In some aspects, the cooling element can include a body having a chamber connected to a channel configured to deliver gas to the chamber. In some aspects, a roof of the chamber can be configured to be disposed adjacent to the reticle 504 and can include a set of openings (e.g., one or more openings) configured to output the gas towards the reticle 504. In some aspects, the set of openings comprise a row of apertures or an array of apertures. In some aspects, the body of the cooling element can further include at least one movable shutter configured to selectively close at least a subset of the row of apertures or the array of apertures. In other aspects, the cooling element can include an open cavity provided in an uppermost face of the body with respect to the reticle 504. In some aspects, the body can be bendable so as to control cooling provided by a portion of the gas disposed (e.g., present) between the cooling element and the reticle 504. In some aspects, the reticle cooling apparatus 520 can further include a thermal shield located between a portion of the cooling element and the reticle 504. In some aspects, the thermal shield can be configured to reduce an amount of heat that is removed from the reticle 504 by the portion of the cooling element.

In some aspects, the reticle cooling apparatus 520 can include a pair of cooling elements that includes a first cooling element 530 and a second cooling element 540. In some aspects, the pair of cooling elements can be provided at opposite sides of the exposed area 512. For example, the first cooling element 530 can be disposed below the reticle 504 and adjacent to the exposed area 512 in the negative Y-direction, and the second cooling element 540 can be disposed below the reticle 504 and adjacent to the exposed area 512 in the positive Y-direction.

As shown in FIG. 5B, in some aspects, the first cooling element 530 can include a first body 532 that includes a first chamber 534 connected to a first channel (not depicted) configured to deliver a first gas (e.g., H2) to the first chamber 534. In some aspects, a first roof 536 of the first chamber 534 can be disposed adjacent to the reticle 504 (e.g., a distance d below the reticle 504 in the negative Z-direction). In some aspects, the first roof 536 can include a first set of openings 538 defined by the first roof 536 and configured to output the first gas towards the reticle 504 (e.g., towards the first cooled area 514 as indicated by a first gaseous flow 539). In some aspects, a density of the first set of openings 538 can vary (e.g., along a direction transverse to a scanning direction of the scanning lithographic apparatus) such that the density of the first set of openings 538 is higher at the outer ends of the first roof 536 than in a central portion of the first roof 536. In some aspects, the first body 532 can further include a first fluid cooling channel 533 configured to remove heat from the first body 532. In some aspects, the reticle cooling apparatus 520 can further include a first thermal shield 550 located between a portion of the first cooling element 530 and the reticle 504. In some aspects, the first thermal shield 550 can be configured to reduce an amount of heat that is removed from the reticle 504 by the portion of the first cooling element 530.

In some aspects, the second cooling element 540 can include a second body 542 that includes a second chamber 544 connected to a second channel (not depicted) configured to deliver a second gas (e.g., H2) to the second chamber 544. In some aspects, a second roof 546 of the second chamber 544 can be disposed adjacent to the reticle 504 (e.g., a distance d below the reticle 504 in the negative Z-direction). In some aspects, the second roof 546 can include a second set of openings 548 configured to output the second gas towards the reticle 504 (e.g., towards the second cooled area 516 as indicated by a second gaseous flow 549). In some aspects, a density of the second set of openings 548 can vary (e.g., along a direction transverse to a scanning direction of the scanning lithographic apparatus) such that the density of the second set of openings 548 is higher at the outer ends of the second roof 546 than in a central portion of the second roof 546. In some aspects, the second body 542 can further include a second fluid cooling channel 543 configured to remove heat from the second body 542. In some aspects, the reticle cooling apparatus 520 can further include a second thermal shield 560 located between a portion of the second cooling element 540 and the reticle 504. In some aspects, the second thermal shield 560 can be configured to reduce an amount of heat that is removed from the reticle 504 by the portion of the second cooling element 540.

In some aspects, the example lithographic apparatus 500 can be a scanning lithographic apparatus configured to form a curved exposed area, and the pair of cooling elements can be curved. For example, the first cooling element 530 can include a concave leading edge corresponding to the curved exposed area. In another example, the first cooling element 530 can include a convex leading edge corresponding to a reflection of the curved exposed area (e.g., about an axis that extends transverse to a scanning direction of a scanning lithographic apparatus). In yet another example, the first cooling element 530 can include a roof member that is curved (e.g., transverse to a scanning direction of the scanning lithographic apparatus) such that the outer ends of the roof member are closer to the reticle 504 than a central portion of the roof member.

Figure 6:
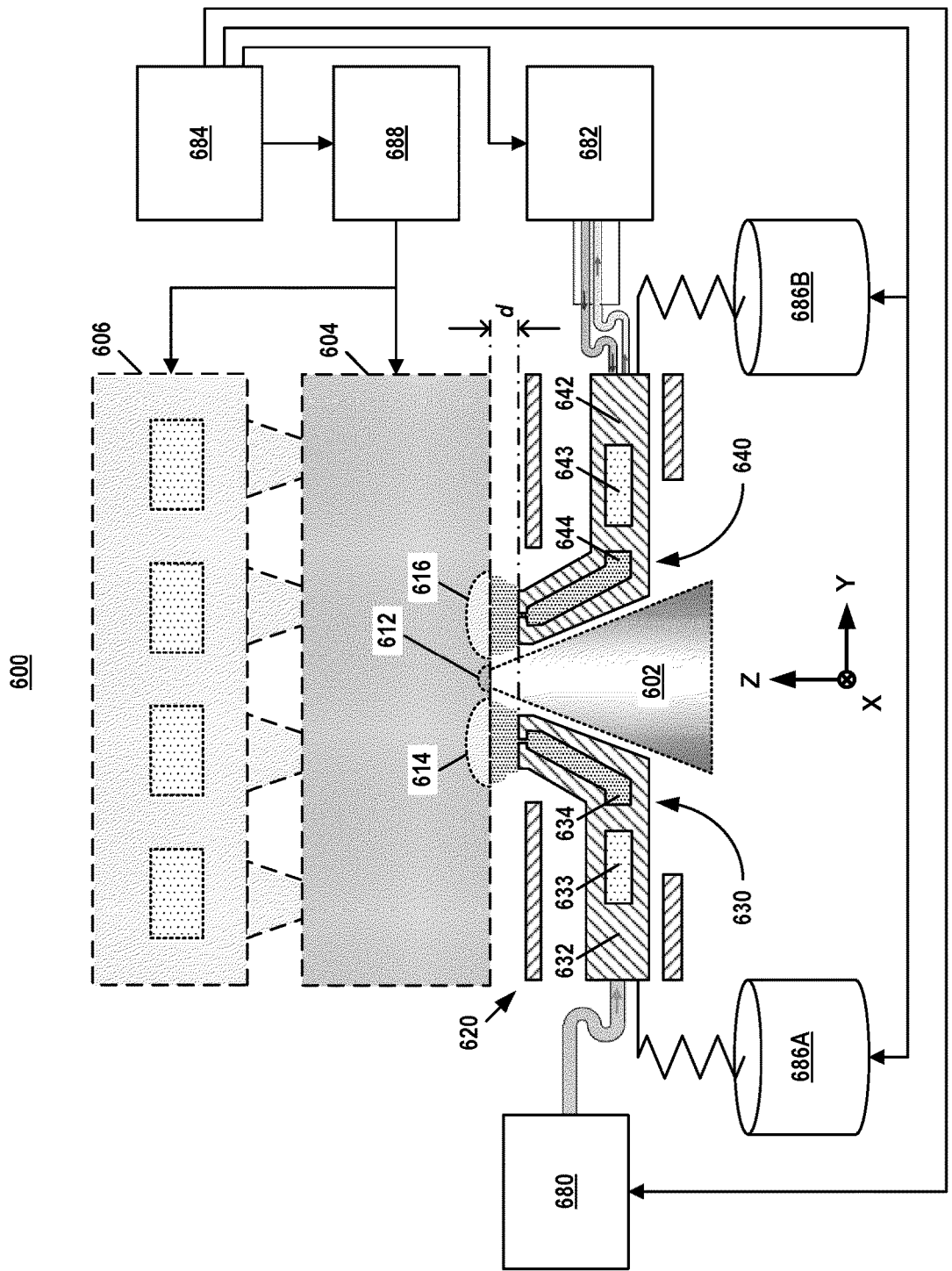
FIG. 6 is a schematic illustration of an example cooling system that includes an example reticle cooling apparatus according to some aspects of the present disclosure.

FIG. 6 is a schematic illustration of a portion of an example lithographic apparatus 600 according to some aspects of the present disclosure. As shown in FIG. 6, the example lithographic apparatus can include an optical system (not depicted) configured to direct a radiation beam 602 (e.g., an EUV radiation beam) onto a reticle 604 supported by a reticle table 606 to form a patterned radiation beam. The radiation beam 602 can cause heating of an exposed area 612 of the reticle 604.

In some aspects, the example lithographic apparatus 600 can include a reticle cooling apparatus 620 configured to remove the heat from the reticle 604 (e.g., from a first cooled area 614 and a second cooled area 616 disposed adjacent to the exposed area 612). In some aspects, the reticle cooling apparatus 620 can include a first cooling element 630 and a second cooling element 640 disposed below the reticle 604 (e.g., within a vertical distance d of less than about 1 mm below the reticle 604 in the negative Z-direction) and adjacent to the exposed area 612 (e.g., within a distance of less than about 3 cm). In some aspects, the first cooling element 630 can include a first body 632 that includes a first chamber 634 connected to a gas source 680 (e.g., an H2 source having an H2 valve) configured to deliver a first gas (e.g., H2) to the first chamber 634. In some aspects, the first body 632 can further include a first fluid cooling channel 633 connected to a cooling cabinet 682 (e.g., a fluid cooling cabinet having a vacuum insulated pipe, a heat exchanger, and a cryo-cooler) and configured to remove heat from the first body 632. In some aspects, the second cooling element 640 can include a second body 642 that includes a second chamber 644 connected to the gas source 680 configured to deliver a second gas (e.g., H2) to the second chamber 644. In some aspects, the second body 642 can further include a second fluid cooling channel 643 connected to the cooling cabinet 682 and configured to remove heat from the second body 642.

In some aspects, the example lithographic apparatus 600 can further include actuators (e.g., three actuators arranged triangularly in the XY-plane) configured to modify a distance d between a roof of the reticle cooling apparatus 620 (e.g., the roof of the first cooling element 630, the roof of the second cooling element 640) and a lower surface of the reticle 604. In some aspects, the actuators can include a first actuator 686A mechanically coupled to the first cooling element 630, a second actuator 686B mechanically coupled to the second cooling element 640, and a third actuator (not depicted) mechanically coupled to both the first cooling element 630 and the second cooling element 640.

In some aspects, the example lithographic apparatus 600 can further include a cooling controller 684 configured to generate a cooling control signal based on timing data for a projection of the patterned radiation beam, absorption data for the exposed area 612 on the reticle 604, and a target heat transfer rate. In some aspects, the cooling control signal can be configured to instruct the reticle cooling apparatus 620 to actuate the actuators to modify the distance d between the roof of the reticle cooling apparatus 620 and the lower surface of the reticle 604. In some aspects, the distance d between the roof of the reticle cooling apparatus 620 and the lower surface of the reticle 604 can be between about 50 micrometers and about 100 micrometers.

In some aspects, the reticle cooling apparatus 620 can further include a first valve (not depicted) configured to selectively restrict a first flow of the first gas within the first chamber 634 of the first cooling element 630. In some aspects, the first valve can define a first gas delivery channel between a first fluid ingress connected to the first chamber 634 and a first fluid egress. In some aspects, the first valve can include a first housing portion and a first sliding member. In some aspects, the first sliding member can be slidable between a first position in which the first gas delivery channel is unrestricted and a second position in which the first gas delivery channel is partially restricted. In some aspects, the first sliding member can be configured not to physically contact the first housing portion.

In some aspects, the reticle cooling apparatus 620 can further include a second valve (not depicted) configured to selectively restrict a second flow of the second gas within the second chamber 644 of the second cooling element 640. In some aspects, the second valve can define a second gas delivery channel between a second fluid ingress connected to the second chamber 644 and a second fluid egress. In some aspects, the second valve can include a second housing portion and a second sliding member. In some aspects, the second sliding member can be slidable between a second position in which the second gas delivery channel is unrestricted and a second position in which the second gas delivery channel is partially restricted. In some aspects, the second sliding member can be configured not to physically contact the second housing portion.

In some aspects, the example lithographic apparatus 600 can further include a reticle temperature adjustment system 688 configured to adjust a first temperature of the reticle 604 to a second temperature above the first temperature before the reticle 604 is placed on the reticle table 606. In some aspects, the example lithographic apparatus 600 can further include a heating apparatus (not depicted) configured to heat the reticle 604. In some aspects, the heating apparatus can include a pair of heating elements including a first heating element and a second heating element. In some aspects, the pair of heating elements can be configured to heat reticle areas located at opposite ends of the exposed area 612 in a non-scanning direction of the lithographic apparatus. In some aspects, the example lithographic apparatus 600 can further include a remote temperature sensing system (not depicted) that includes a photodetector configured to detect thermal radiation emitted from a target area of the reticle 604.

In some aspects, the cooling control signal generated by the cooling controller 684 can be further configured to modify an operation of the reticle cooling apparatus 620 (e.g., the first cooling element 630, the second cooling element 640), the gas source 680, the cooling cabinet 682, the actuators (e.g., the first actuator 686A, the second actuator 686B), the reticle temperature adjustment system 688, any other suitable component or device, or any combination thereof. In some aspects, the cooling controller 684 can be configured to transmit (e.g., directly or indirectly via one or more wired or wireless communications paths) the cooling control signal to the reticle cooling apparatus 620 (e.g., the first cooling element 630, the second cooling element 640), the gas source 680, the cooling cabinet 682, the actuators (e.g., the first actuator 686A, the second actuator 686B), the reticle temperature adjustment system 688, any other suitable component or device, or any combination thereof.

Figure 7A:
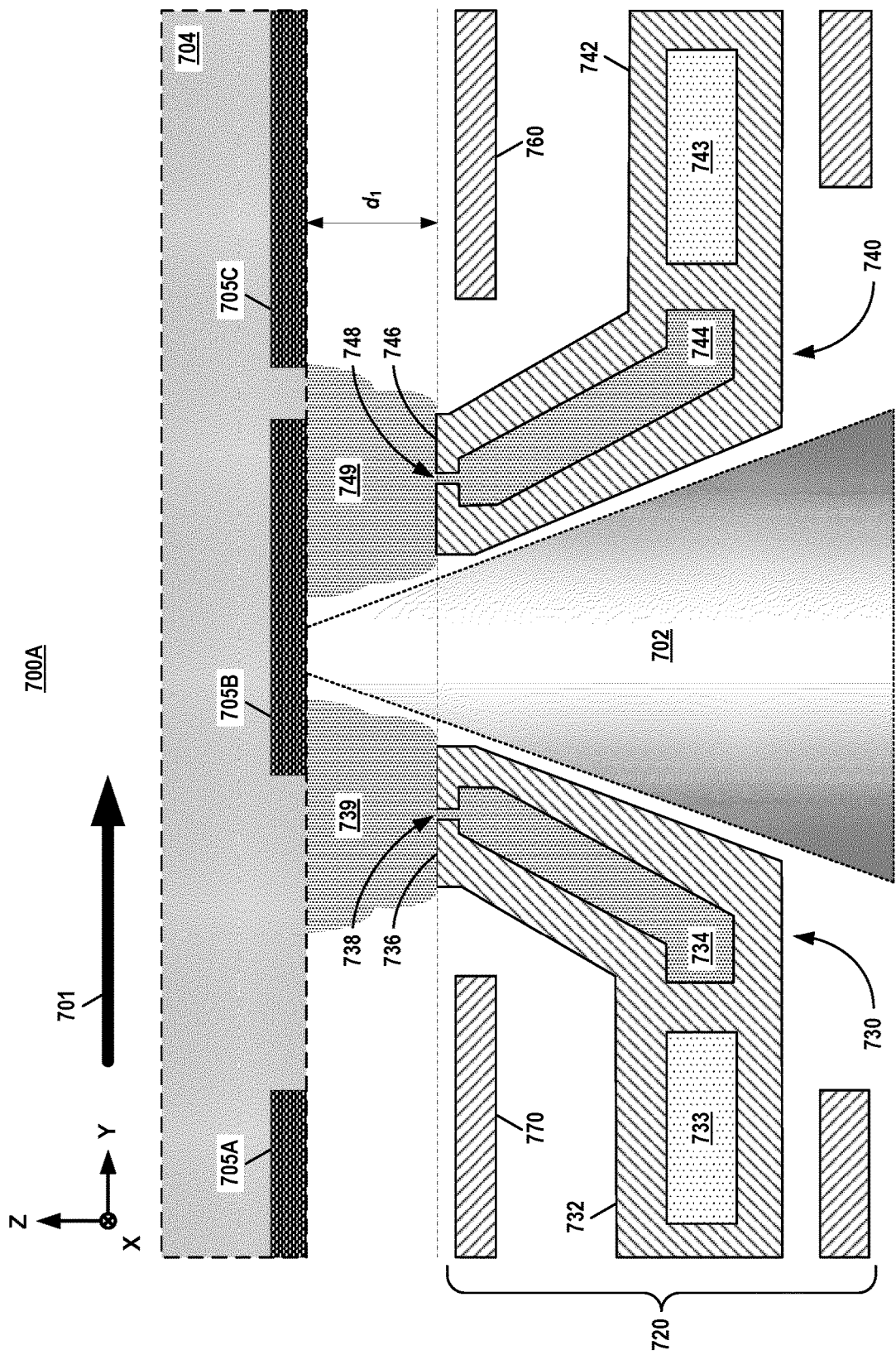
FIGS. 7A and 7B are schematic illustrations of an example operation of an example reticle cooling apparatus according to some aspects of the present disclosure.
Figure 7B:
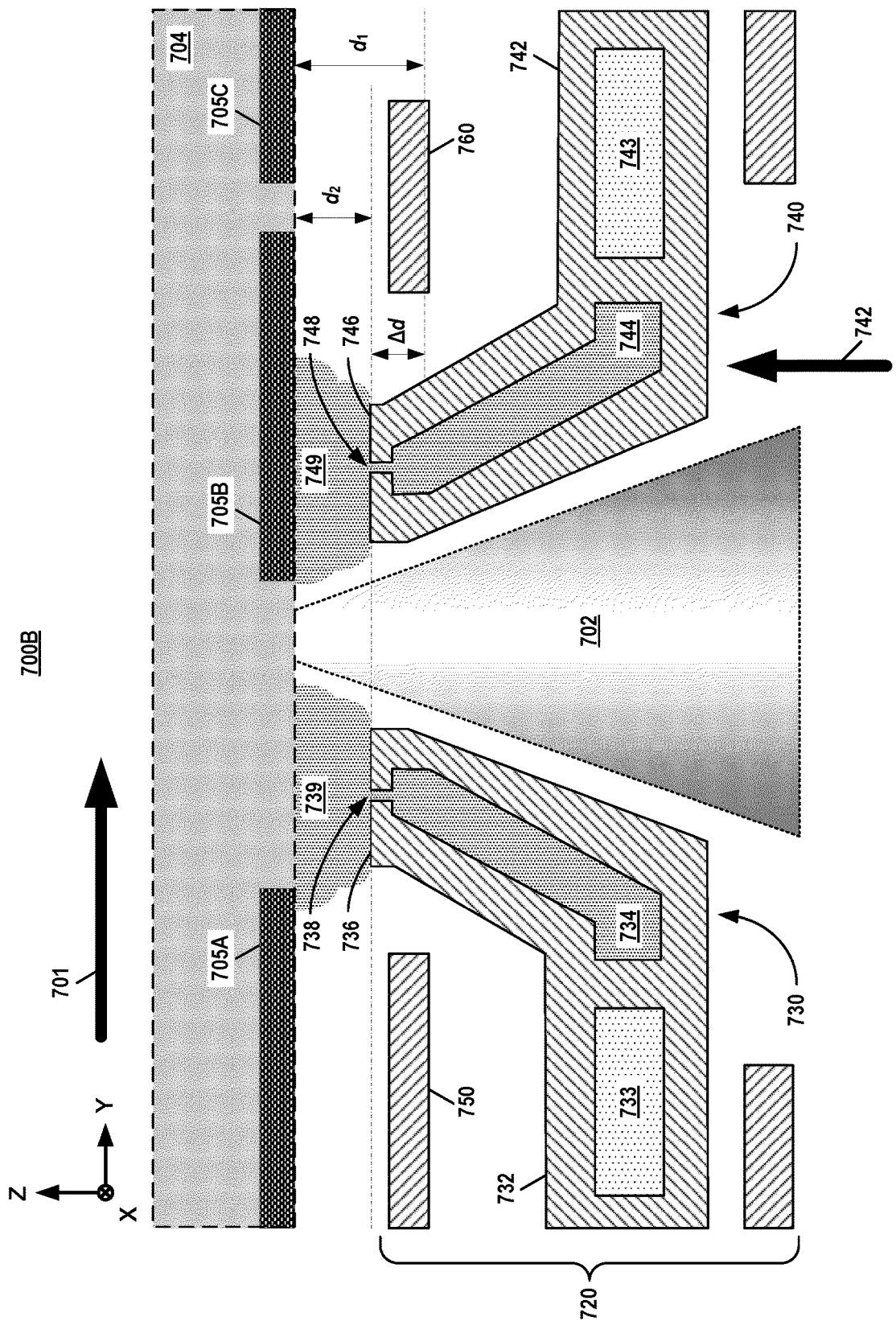

FIGS. 7A and 7B are schematic illustrations of an example operation of a portion of an example lithographic apparatus 700A at a first time and the portion of the example lithographic apparatus 700B at a second time after the first time, according to some aspects of the present disclosure. As shown in FIG. 7A, the example lithographic apparatus 700A can include an optical system (not depicted) configured to direct a radiation beam 702 (e.g., an EUV radiation beam) onto a reticle 704 supported by a reticle table (not depicted) to form a patterned radiation beam by reflecting the radiation beam 702 off of the patterned areas of the reticle 704, such as the patterning areas 705A, 705B, and 705C. The radiation beam 702 can cause heating of an exposed area of the reticle 704.

In some aspects, the example lithographic apparatus 700A can include a reticle cooling apparatus 720 configured to remove the heat from the reticle 704. For example, the reticle cooling apparatus 720 can be configured to remove heat from a first cooled area disposed adjacent (e.g., in the negative Y-direction) to the exposed area of the reticle 704. Additionally or alternatively, the reticle cooling apparatus 720 can be configured to remove heat from a second cooled area disposed adjacent (e.g., in the positive Y-direction) to the exposed area of the reticle 704.

In some aspects, the reticle cooling apparatus 720 can include a first cooling element 730 and a second cooling element 740 located at opposite sides of the exposed area. For example, the first cooling element 730 can be disposed below the reticle 704 and adjacent to the exposed area in the negative Y-direction, and the second cooling element 740 can be disposed below the reticle 704 and adjacent to the exposed area in the positive Y-direction.

In some aspects, the first cooling element 730 can include a first body 732 that includes a first chamber 734 connected to a first channel (not depicted) configured to deliver a first gas (e.g., H2) to the first chamber 734. In some aspects, at the first time, a first roof 736 of the first chamber 734 can be disposed adjacent to the reticle 704 at about a first distance $d_1$ below the reticle 704 in the negative Z-direction. In some aspects, the first roof 736 can include a first set of openings 738 configured to output the first gas towards the first cooled area of the reticle 704 as indicated by a first gaseous flow 739. In some aspects, a density of the first set of openings 738 can vary along a direction transverse to a scanning direction 701 such that the density of the first set of openings 738 is higher at the outer ends of the first roof 736 than in a central portion of the first roof 736. In some aspects, the first body 732 can further include a first fluid cooling channel 733 configured to remove heat from the first body 732. In some aspects, the reticle cooling apparatus 720 can further include a first thermal shield 750 located between a portion of the first cooling element 730 and the reticle 704. In some aspects, the first thermal shield 750 can be configured to reduce an amount of heat that is removed from the reticle 704 by the portion of the first cooling element 730.

In some aspects, the second cooling element 740 can include a second body 742 that includes a second chamber 744 connected to a second channel (not depicted) configured to deliver a second gas (e.g., H2) to the second chamber 744. In some aspects, a second roof 746 of the second chamber 744 can be disposed adjacent to the reticle 704 at about the first distance $d_1$ below the reticle 704 in the negative Z-direction. In some aspects, the second roof 746 can include a second set of openings 748 configured to output the second gas towards the second cooled area of the reticle 704 as indicated by a second gaseous flow 749. In some aspects, a density of the second set of openings 748 can vary along a direction transverse to the scanning direction 701 such that the density of the second set of openings 748 is higher at the outer ends of the second roof 746 than in a central portion of the second roof 746. In some aspects, the second body 742 can further include a second fluid cooling channel 743 configured to remove heat from the second body 742. In some aspects, the reticle cooling apparatus 720 can further include a second thermal shield 760 located between a portion of the second cooling element 740 and the reticle 704. In some aspects, the second thermal shield 760 can be configured to reduce an amount of heat that is removed from the reticle 704 by the portion of the second cooling element 740.

Referring to FIG. 7B, in some aspects, the reticle cooling apparatus 720 can include, or be mechanically coupled to, actuators (e.g., three actuators arranged triangularly in the XY-plane) configured to modify, in response to a receipt of a cooling control signal from a cooling controller, the distance between a lower surface of the reticle 704 and the first roof 736 of the first cooling element 730, the second roof 746 of the second cooling element 740, or both.

In some aspects, the reticle cooling apparatus 720 can include, or be electrically or otherwise communicatively coupled to, a cooling controller configured to generate a cooling control signal based on timing data for a projection of the patterned radiation beam, absorption data for the exposed area on the reticle 704, and a target heat transfer rate. In some aspects, the cooling control signal can be configured to instruct the reticle cooling apparatus 720 to actuate the actuators to modify (e.g., by a change of distance Δd) the distance between the lower surface of the reticle 704 and the first roof 736 of the first cooling element 730, the second roof 746 of the second cooling element 740, or both. In some aspects, the change of distance $\Delta d=|d_1-d_2|$, where positive values of Δd correspond to movement of the reticle cooling apparatus 720 in the positive Z-direction and thus increase the effective heat transfer rate to achieve increased cooling, and negative values of Δd correspond to movement of the reticle cooling apparatus 720 in the negative Z-direction and thus decrease the effective heat transfer rate to achieve decreased cooling. In some aspects, the cooling controller can be configured to transmit (e.g., directly or indirectly via one or more wired or wireless communications paths) the cooling control signal to the reticle cooling apparatus 720 (e.g., the first cooling element 730, the second cooling element 740), the actuators, any other suitable component or device, or any combination thereof.

In one illustrative and nonlimiting example, the first distance $d_1$ can be about 70 micrometers at a first time when the exposed area of the reticle 704 coincides with a patterning area 705B, as shown in FIG. 7A, resulting in relatively less heating of the reticle 704. Subsequently, the cooling controller can determine that a gap in patterning areas (e.g., resulting in relatively more heating of the reticle 704) is coming up at a second time later than the first time and, in response to the determination, generate a cooling control signal configured to instruct the reticle cooling apparatus 720 to actuate the actuators to modify the distance between the lower surface of the reticle 704 and the first roof 736 of the first cooling element 730, the second roof 746 of the second cooling element 740, or both, by a change of distance Δd of about 20 micrometers to increase the effective heat transfer rate to achieve increased cooling in the first cooling area and the second cooling area adjacent to the exposed area of the reticle 704. The cooling controller can transmit the cooling control signal to the actuators (e.g., directly, or indirectly via the reticle cooling apparatus 720). The actuators can receive the cooling control signal and modify (e.g., by moving the reticle cooling apparatus upwards as indicated by the arrow 742) the distance between the lower surface of the reticle 704 and the first roof 736 of the first cooling element 730, the second roof 746 of the second cooling element 740, or both, by the change of distance Δd of about 20 micrometers so that a second distance $d_2$ is about 50 micrometers at the second time when the exposed area of the reticle 704 does not coincide with a patterning area, as shown in FIG. 7B.

Figure 8:
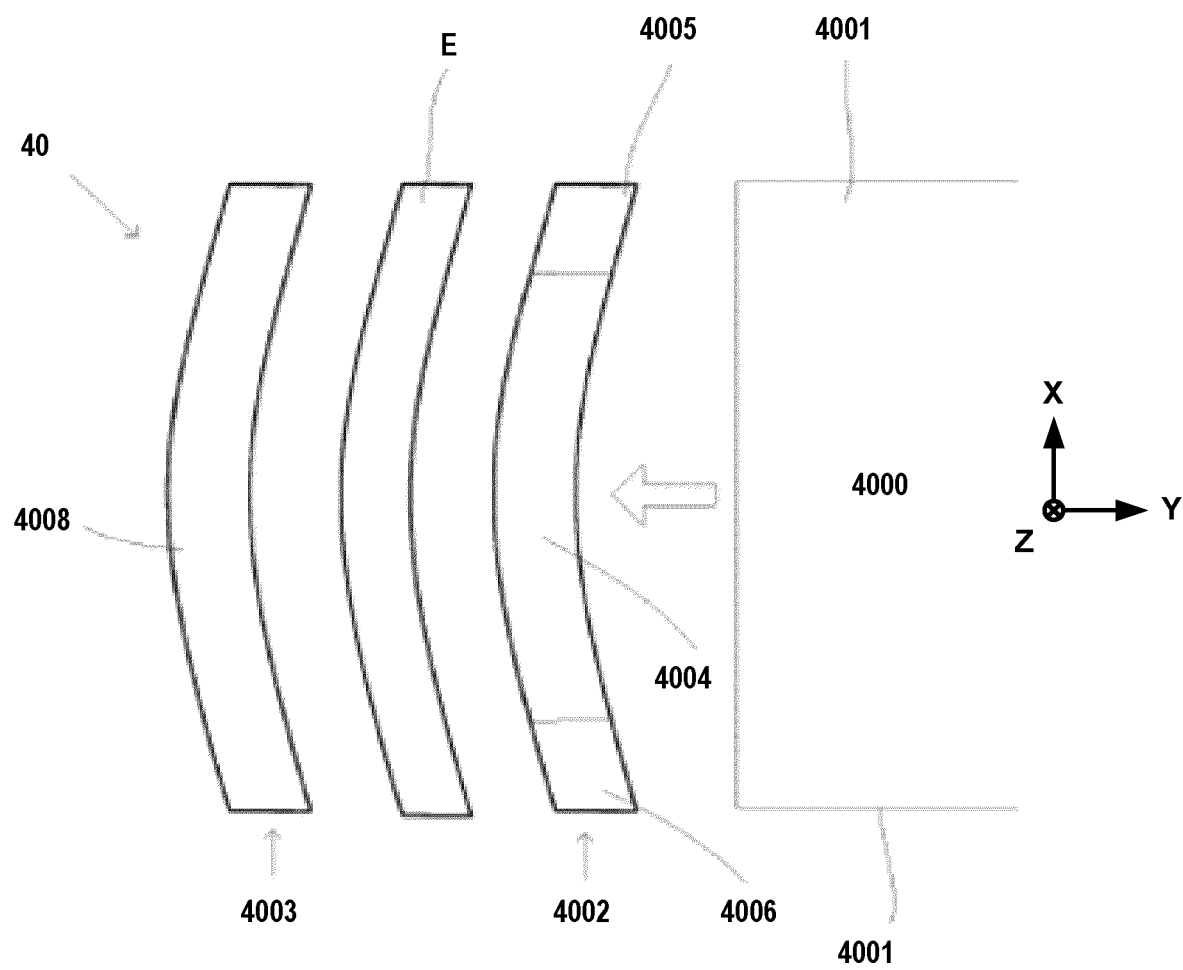
FIG. 8 is a schematic illustration of another reticle cooling apparatus according to some aspects of the present disclosure.
Figure 9:
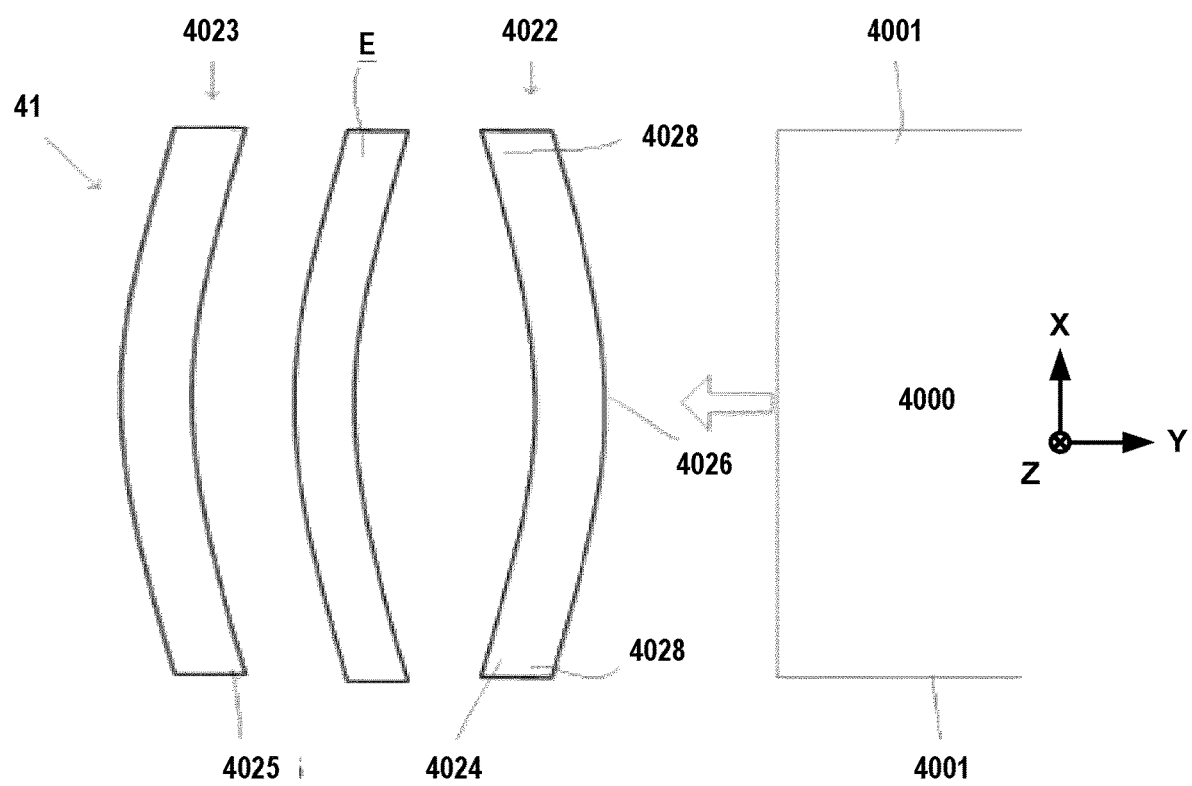
FIG. 9 is a schematic illustration of another reticle cooling apparatus according to some aspects of the present disclosure.
Figure 10:
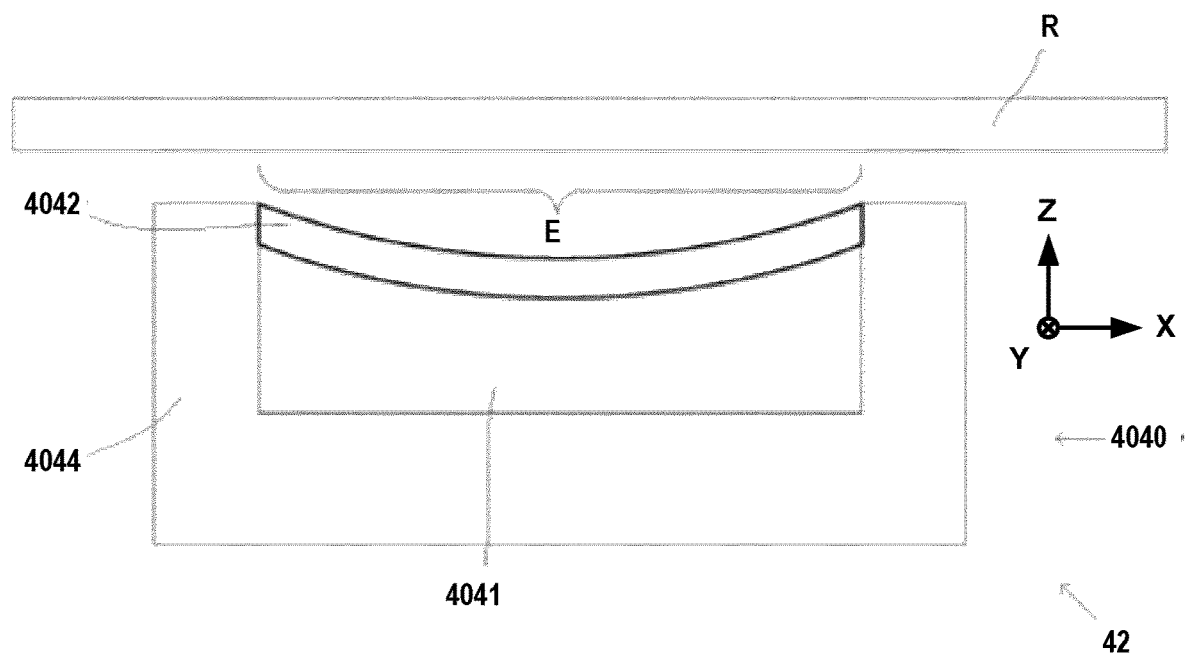
FIG. 10 is a schematic illustration of another reticle cooling apparatus according to some aspects of the present disclosure.

FIGS. 8, 9, and 10 schematically depict example embodiments of example reticle cooling apparatuses configured to address the issue of uniform cooling power distribution according to various aspects. The embodiments of FIGS. 8, 9, and 10 may include some features which are common with previously described embodiments, such as some features from the embodiments described with reference to FIGS. 5A, 5B, 6, 7A, and 7B. For brevity, features depicted and/or described in connection with other embodiments are omitted from the following.

In one aspect, FIG. 8 depicts a cross-section 800 of a portion of a reticle cooling apparatus 40 (e.g., viewed from below) which includes a first cooling element 4002 and a second cooling element 4003. A curved exposed area E is also depicted. The curved exposed area E, the first cooling element 4002, and the second cooling element 4003 are curved. The first cooling element 4002 can be separated into three chambers: an inner chamber 4004; a first outer chamber 4005; and a second outer chamber 4006. The first outer chamber 4005 and the second outer chamber 4006 are located on either side of the inner chamber 4004. Following the Cartesian coordinate system used for lithographic apparatuses, the first outer chamber 4005 and the second outer chamber 4006 are located on either side of the inner chamber 4004 in the X-direction (e.g., either side in the non-scanning direction). The second cooling element 4003 can be provided with a single chamber 4008. A roof provided with openings (not depicted) may be located above the chambers 4004, 4005, 4006, and 4008, and cooling gas may flow out of the openings onto a reticle to cool the reticle.

In some aspects, the first cooling element 4002 and the second cooling element 4003 may have a curved shape with a curve which generally corresponds with the curve of the curved exposed area E. The width of the first cooling element 4002 and the second cooling element 4003 may be different from the width of the curved exposed area E (e.g., the curved exposed area E may be narrower than the cooling elements).

In some aspects, the first cooling element 4002 may be considered to have a concave leading edge. The leading edge can be an edge of the first cooling element 4002 which first encounters a target area 4000 when the scanning direction is such that the first cooling element 4002 leads the second cooling element 4003 (e.g., during a scanning exposure in the negative Y-direction, as indicated by the arrow shown in FIG. 8, the first cooling element 4002 encounters the target area 4000 before the second cooling element 4003).

In some aspects, the second cooling element 4003 may be considered to have a convex leading edge. The leading edge can be an edge of the second cooling element 4003 which first encounters a target area when the scanning direction is such that the second cooling element 4003 leads the first cooling element 4002 (e.g., during a scanning exposure in the positive Y-direction, opposite to the arrow shown in FIG.

8, the second cooling element 4003 encounters the target area before the first cooling element 4002).

In some aspects, during a scanning exposure with movement of a reticle in the negative Y-direction, outer edges 4001 of a target area 4000 are heated by the radiation beam before a middle portion of the curved exposed area E. This may cause deformation of the curved exposed area E, which can be difficult to correct for using the projection system PS of the lithographic apparatus 100 or 100'. This can be addressed by providing cooling gas at the first outer chamber 4005 and the second outer chamber 4006 before cooling gas is provided at the inner chamber 4004. This may be achieved, for example, by opening valves connected to the first outer chamber 4005 and the second outer chamber 4006 before opening a valve connected to the inner chamber 4004. Additionally or alternatively, stronger cooling may be provided from the first outer chamber 4005 and the second outer chamber 4006 than is provided from the inner chamber 4004. The stronger cooling may be achieved, for example, by providing cooling gas at a higher pressure or lower temperature in the first outer chamber 4005 and the second outer chamber 4006 than in the inner chamber 4004.

In some aspects, the reticle cooling apparatus 40 may provide focused or dedicated cooling at outer edges 4001 of the target area 4000. As a result, the outer edges 4001 of the target area 4000 may be cooler than the central portion of the target area 4000 when exposure of the target area 4000 begins. Consequently, initial heating of the outer edges 4001 of the target area 4000 during lithographic exposure causes reduced third-order deformation of the curved exposed area E.

In some aspects, the second cooling element 4003 can consist of a single chamber 4008 rather than three chambers. This is because third-order deformation can be reduced when the scanning direction is reversed (e.g., during a scanning exposure in the positive Y-direction, opposite to the arrow shown in FIG. 8) and the second cooling element 4003 precedes the curved exposed area E at a target area 4000. In some aspects, third-order deformation can arise when outer edges 4001 of the target area 4000 are heated before a central portion of the target area 4000 during a scanning exposure in the negative Y-direction, but this may not occur during a scanning exposure in the positive Y-direction. Since the third-order deformation issue may not arise when the second cooling element 4003 precedes the curved exposed area E, separating the single chamber 4008 into three chambers may provide less of a benefit. As a result, the reticle cooling apparatus 40 can reduce third-order deformation of the target area 4000 using the first cooling element 4002 and the second cooling element 4003, which can be relatively simple structures (e.g., three chambers 4004, 4005, and 4006 on one side in embodiments where having three chambers provides a benefit, but only one chamber 4008 on the other side in embodiments where having three chambers provides less of a benefit). In some aspects, the second cooling element 4003 can be separated into three chambers similar to the first cooling element 4002.

In some aspects, due to the curved shape of the exposure slit, either the center or the left and right sides of the curved exposed area E are exposed earlier, depending on the scan direction. To minimize the overlay error, it may be preferred to cool differently over the width of the curved exposed area E. A curved shaped cooling gas flux, arranged over the width of the cooling surface such as to obtain a cooling flux distribution, may be realized by choosing an appropriate distribution of the holes in the roof of the cooling element. However, having a cooling flux distribution over the width works the best in a rarefied (e.g., low pressure) gas regime and not in a continuum (e.g., high pressure) gas regime. In such aspects, a gas (e.g., H2) may be chosen to work in a rarefied regime and another gas (e.g., N2) may be chosen to work close to the continuum regime. If a choked gas flow is chosen, the profile may scale almost linearly with the gap height.

FIG. 9 depicts a cross-section 900 of a portion of a reticle cooling apparatus 41 (e.g., viewed from below) which includes a first cooling element 4022 and a second cooling element 4023. The first cooling element 4022 includes a first chamber 4024, and the second cooling element 4023 includes a second chamber 4025. The curved exposed area E is also depicted in FIG. 9. A roof provided with openings (not depicted) may be located above the first chamber 4024 and the second chamber 4025, and cooling gas may flow out of the openings onto a reticle to cool the reticle.

In some aspects, the curved exposed area E, the first chamber 4024, and the second chamber 4025 are all curved. However, in the embodiment shown in FIG. 9, the first chamber 4024 of the first cooling element 4022 has a curve which can be substantially a mirror image (e.g., a reflection about the X-axis) of the curved exposed area E. In other words, the first chamber 4024 of the first cooling element 4022 can be curved in an opposite direction to the curved exposed area E. The curve of the second chamber 4025 of the second cooling element 4023 generally corresponds with the curve of the curved exposed area E.

In some aspects, during a scanning exposure in the negative Y-direction, as depicted by the arrow in FIG. 9, the first cooling element 4022 precedes the curved exposed area E over an area of a reticle. In some aspects, it may be desirable to provide more cooling of the curved exposed area E at edges of the curved exposed area E than at a central portion of the curved exposed area E. In the embodiment shown in FIG. 9, this may be achieved by postponing the time at which cooling is provided by the first cooling element 4022. Specifically, cooling may be postponed (e.g., based on a cooling control signal or a portion thereof) such that it does not begin when a central point 4026 of a leading edge of the first chamber 4024 passes over a start of the target area 4000. Instead, cooling may be postponed, for example, until outer ends 4028 of the first chamber 4024 arrive at the outer edges 4001 of the target area 4000. When this approach is used, outer edges 4001 of the target area 4000 receive full cooling from the first cooling element 4022, whereas a central portion of the target area 4000 may not receive full cooling but instead may receive less cooling. Consequently, third-order deformation caused by outer edges 4001 of the target area 4000 being exposed before the central region of the target area 4000 can be prevented or reduced.

In some aspects, the third-order deformation issue may not arise when scanning in the opposite direction (e.g., in the positive Y-direction). For this reason, the second chamber 4025 of the second cooling element 4023 may not be a mirror image of the curved exposed area E.

FIG. 10 depicts a cross-section 1000 of a portion of a reticle cooling apparatus 42 (e.g., viewed from the side) which includes a cooling element 4040 according to an aspect. In FIG. 10, the reticle cooling apparatus 42 is depicted using a cross-section along the Y-direction. The cooling element 4040 includes a housing 4044 which defines a chamber 4041 and a roof member 4042 (e.g., which may also be referred to as a curved roof). The roof member 4042 can be provided with openings (not depicted) through which cooling gas passes from the chamber 4041 onto a reticle R in use. The roof member 4042 can be curved such that outer ends of the roof member 4042 (e.g., in the X-direction) are closer to the reticle R than a central portion of the roof member 4042. This advantageously provides stronger cooling of the reticle at edges of an exposed area E (e.g., a curved exposed area E as shown in FIGS. 8 and 9) than at a central portion of the exposed area E. This can reduce the third-order deformation. The curvature of the roof member 4042 may be, for example, substantially parabolic.

In some aspects, piezo-actuators (not depicted) may be provided at ends of the roof member 4042. The piezo-actuators may be used to modify (e.g., based on a cooling control signal or a portion thereof) a curvature of the roof member 4042. For example, the piezo-actuators may be used to move the roof member from a curved arrangement (e.g., as depicted in FIG. 10) to a flat arrangement. For example, the curved arrangement may be used when edges of a target area are illuminated by the exposed area E but a central portion of the target area is not illuminated. The roof member 4042 may then be moved to a flat profile when all of the target area is illuminated by the exposed area E.

In other aspects (not depicted), instead of providing a roof member 4042, the roof of the housing 4044 may be flat, but may be provided with a higher density of openings at outer ends of the roof (e.g., in the X-direction) than in a central portion of the roof. The hole density may be configured to provide cooling which can be equivalent to the cooling provided by a parabolic curved roof having a constant hole density. The term "hole density" refers to the proportion of the roof which is open compared with the proportion of the roof which is closed.

In some aspects, the first and second cooling elements located on either side of the exposed area E may be switched on and off independently. This may apply to any of the embodiments depicted in FIGS. 8, 9, and 10, or in connection with other embodiments.

In some aspects, features described with reference to FIGS. 8, 9, and 10 may be combined with each other or with other features. For example, the reversed curvature as depicted in FIG. 9 may be combined with separation of the cooling chamber into an inner chamber and outer chambers as depicted in FIG. 8. In another example, the reversed curvature as depicted in FIG. 9 may be combined with independent switching of the first and second cooling elements. In another example, the curved roof (or modified hole density) may be combined with independent switching of the first and second cooling elements.

In some aspects, any of the reticle cooling apparatuses disclosed herein, or a combination thereof, may form part of a reticle inspection apparatus. The reticle inspection apparatus may use EUV radiation to illuminate a reticle and use an imaging sensor to monitor radiation reflected from the reticle. Images received by the imaging sensor are used to determine whether or not defects are present in the reticle. The reticle inspection apparatus may include optics (e.g., mirrors) configured to receive EUV radiation from an EUV radiation source and form it into a radiation beam to be directed at a reticle. The reticle inspection apparatus may further include optics (e.g., mirrors) configured to collect EUV radiation reflected from the reticle and form an image of the reticle at the imaging sensor. The reticle inspection apparatus may include a processor configured to analyze the image of the reticle at the imaging sensor, and to determine from that analysis whether any defects are present on the reticle. The processor may further be configured to determine whether a detected reticle defect will cause an unacceptable defect in images projected onto a substrate when the reticle is used by a lithographic apparatus.

In some aspects, any of the reticle cooling apparatuses disclosed herein, or a combination thereof, may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may be located, for example, adjacent to a lithographic apparatus and may be used to measure the overlay before the substrate (and the resist) has been processed.

In some aspects, although the disclosed embodiments are described in the context of lithographic apparatuses, the embodiments disclosed herein may also be used in the context of other apparatuses. For example, the embodiments disclosed herein may form part of a reticle inspection apparatus, a metrology apparatus, or any apparatus that measures or processes an object such as a substrate (e.g., wafer) or reticle (e.g., mask or other patterning device). These apparatuses may be generally referred to as lithographic tools. Such lithographic tools may use vacuum conditions (e.g., as in EUV radiation) or ambient (non-vacuum) conditions (e.g., as in DUV radiation). In some embodiments, the term "EUV radiation" may be considered to encompass electromagnetic radiation having a wavelength within the range of 4-20 nm (e.g., within the range of 13-14 nm). EUV radiation may have a wavelength of less than 10 nm (e.g., within the range of 4-10 nm, such as 6.7 nm or 6.8 nm).

Example Processes for Removing Heat From a Reticle

Figure 11:
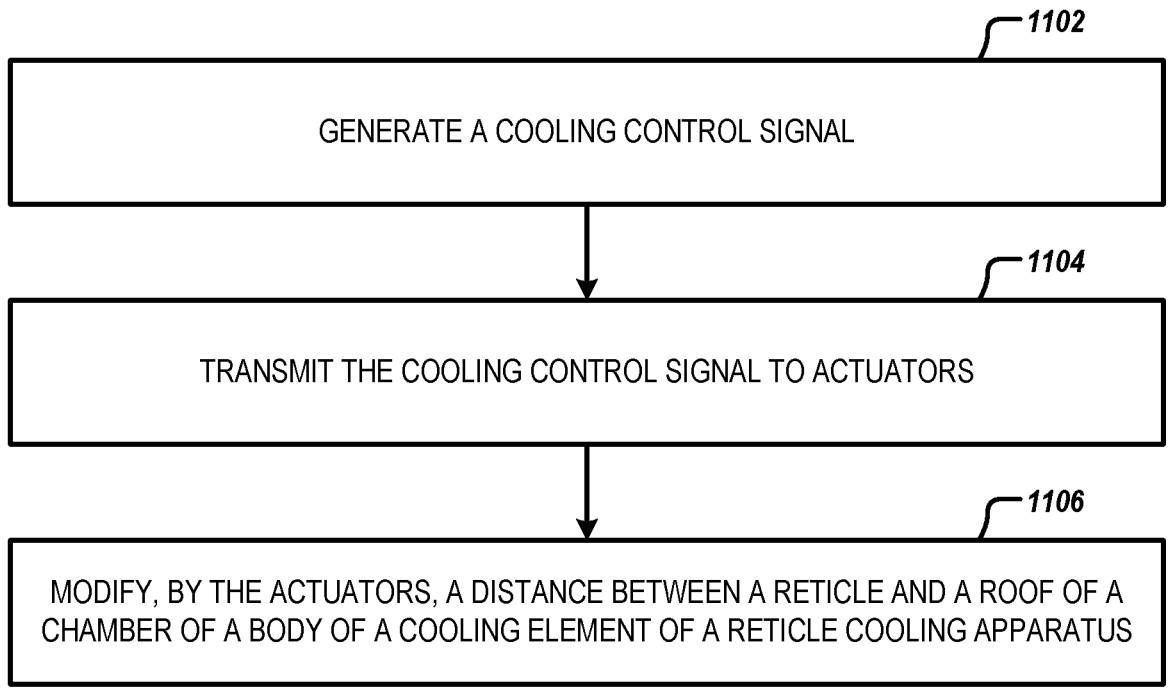
FIG. 11 is an example method for removing heat from a reticle according to some aspects of the present disclosure or portion(s) thereof.

FIG. 11 is an example method 1100 for removing heat from a reticle according to some aspects of the present disclosure or portion(s) thereof. The operations described with reference to example method 1100 can be performed by, or according to, any of the systems, apparatuses, components, techniques, or combinations thereof described herein, such as those described with reference to FIGS. 1-10 above and FIG. 12 below.

At operation 1102, the method can include generating, by a cooling controller, a cooling control signal based on timing data for a projection of a patterned radiation beam formed by illuminating an exposed area on a reticle supported by a reticle table, absorption data for the exposed area, and a target heat transfer rate. In some aspects, the cooling control signal can instruct a reticle cooling apparatus to actuate actuators to modify a distance between the reticle and a roof of a chamber connected to a channel for delivering gas to the chamber. In some aspects, the channel can be disposed in a body of a cooling element of the reticle cooling apparatus. In some aspects, in addition to operation 1102 or as an alternative thereto, the method can include measuring the distortion of a reticle using two fiducials (e.g., transmission image sensor (TIS) marks or any other suitable fiducials) and using the distortion measurement to adjust the cooling, heating, or both provided by the reticle cooling apparatus. In some aspects, the generating of the cooling control signal can be accomplished using suitable mechanical, electrical, or other methods and include generating the cooling control signal in accordance with any aspect or combination of aspects described with reference to FIGS. 1-10 above and FIG. 12 below.

At operation 1104, the method can include transmitting, by the cooling controller, the cooling control signal to the actuators. In some aspects, the transmitting of the cooling control signal can be accomplished using suitable mechanical, electrical, or other methods and include transmitting the cooling control signal in accordance with any aspect or combination of aspects described with reference to FIGS. 1-10 above and FIG. 12 below.

At operation 1106, the method can include modifying, by the actuators and based on the cooling control signal, the distance between the reticle and the roof (e.g., from the first distance $d_1$ shown in FIG. 7A to the second distance $d_2$ shown in FIG. 7B) to modify a heat transfer rate associated with a removal of heat from the reticle towards the target heat transfer rate. In some aspects, the modifying of the distance between the reticle and the roof can be accomplished using suitable mechanical, electrical, or other methods and include modifying the distance between the reticle and the roof in accordance with any aspect or combination of aspects described with reference to FIGS. 1-10 above and FIG. 12 below.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 12:
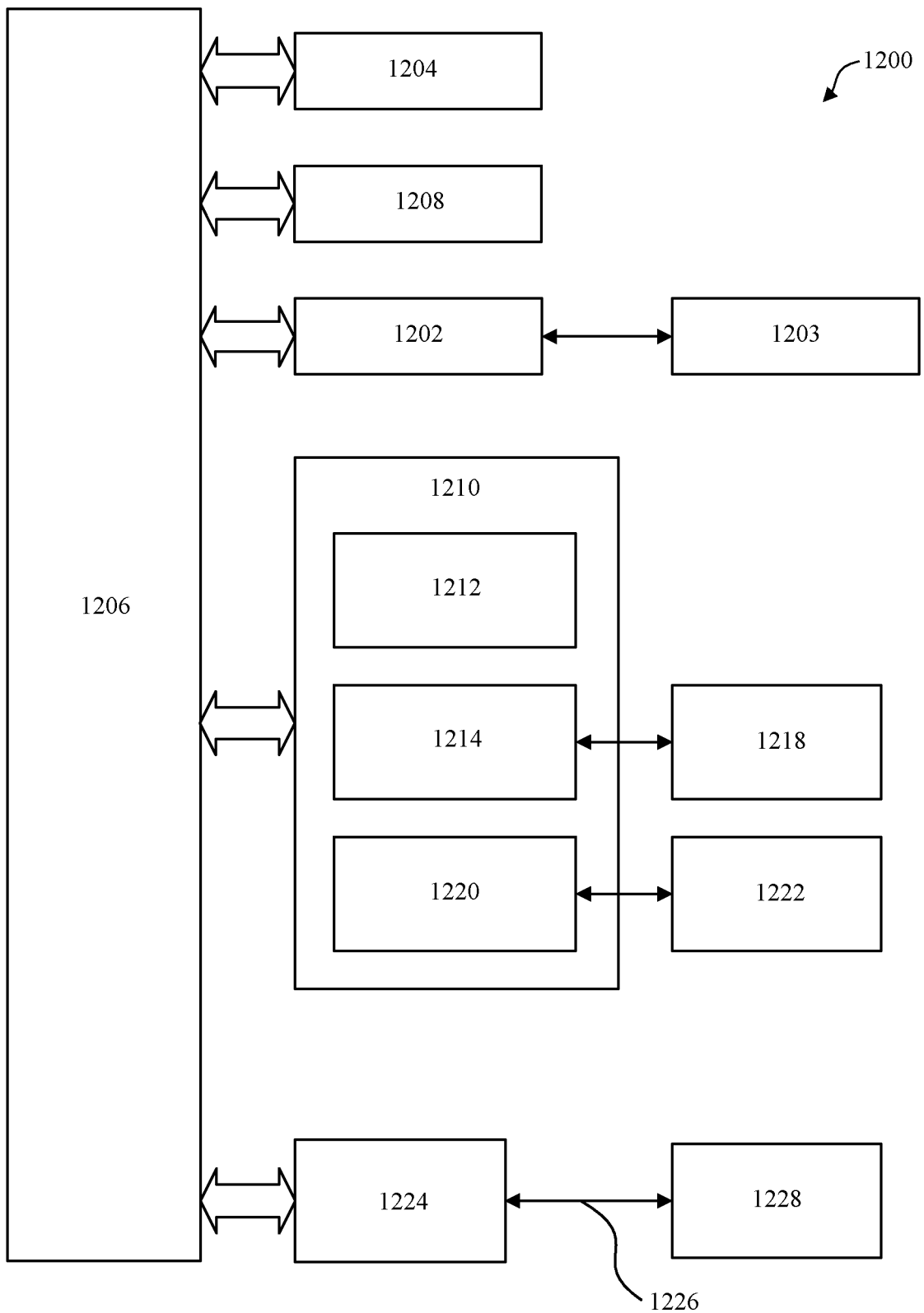
FIG. 12 is an example computer system for implementing some aspects of the present disclosure or portion(s) thereof.

Various aspects can be implemented, for example, using one or more computing systems, such as example computing system 1200 shown in FIG. 12. Example computing system 1200 can be a specialized computer capable of performing the functions described herein such as: the example laser system 401 described with reference to FIG. 4; the reticle cooling apparatus 520 described with reference to FIG. 5; the reticle cooling apparatus 620, gas source 680, cooling cabinet 682, cooling controller 684, actuators (e.g., first actuator 686A, second actuator 686B), or reticle temperature adjustment system 688 described with reference to FIG. 6; the reticle cooling apparatus 720, cooling controller, or actuators described with reference to FIG. 7; any other suitable system, sub-system, or component; or any combination thereof. Example computing system 1200 can include one or more processors (also called central processing units, or CPUs), such as a processor 1204. Processor 1204 is connected to a communication infrastructure 1206 (e.g., a bus). Example computing system 1200 can also include user input/output device(s) 1203, such as monitors, keyboards, pointing devices, etc., that communicate with communication infrastructure 1206 through user input/output interface(s) 1202. Example computing system 1200 can also include a main memory 1208 (e.g., one or more primary storage devices), such as random access memory (RAM). Main memory 1208 can include one or more levels of cache. Main memory 1208 has stored therein control logic (e.g., computer software) and/or data.

Example computing system 1200 can also include a secondary memory 1210 (e.g., one or more secondary storage devices). Secondary memory 1210 can include, for example, a hard disk drive 1212 and/or a removable storage drive 1214. Removable storage drive 1214 can be a floppy disk drive, a magnetic tape drive, a compact disk drive, an optical storage device, tape backup device, and/or any other storage device/drive.

Removable storage drive 1214 can interact with a removable storage unit 1218. Removable storage unit 1218 includes a computer usable or readable storage device having stored thereon computer software (control logic) and/or data. Removable storage unit 1218 can be a floppy disk, magnetic tape, compact disk, DVD, optical storage disk, and/or any other computer data storage device. Removable storage drive 1214 reads from and/or writes to removable storage unit 1218.

According to some aspects, secondary memory 1210 can include other means, instrumentalities or other approaches for allowing computer programs and/or other instructions and/or data to be accessed by example computing system 1200. Such means, instrumentalities or other approaches can include, for example, a removable storage unit 1222 and an interface 1220. Examples of the removable storage unit 1222 and the interface 1220 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1200 can further include a communications interface 1224 (e.g., one or more network interfaces). Communications interface 1224 enables example computing system 1200 to communicate and interact with any combination of remote devices, remote networks, remote entities, etc. (individually and collectively referred to as remote devices 1228). For example, communications interface 1224 can allow example computing system 1200 to communicate with remote devices 1228 over communications path 1226, which can be wired and/or wireless, and which can include any combination of LANs, WANs, the Internet, etc. Control logic, data, or both can be transmitted to and from example computing system 1200 via communications path 1226.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1200, main memory 1208, secondary memory 1210 and removable storage units 1218 and 1222, as well as tangible articles of manufacture embodying any combination of the foregoing. Such control logic, when executed by one or more data processing devices (such as example computing system 1200), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 12. In particular, aspects of the disclosure can operate with software, hardware, and/or operating system implementations other than those described herein.

The embodiments may further be described using the following clauses:

1. A lithographic apparatus, comprising:
    an optical system configured to direct a radiation beam onto a reticle supported by a reticle table to form a patterned radiation beam, wherein the radiation beam causes heating of an exposed area of the reticle; and
    a reticle cooling apparatus configured to remove heat from the reticle, wherein the reticle cooling apparatus comprises:
        a cooling element disposed below the reticle and adjacent to the exposed area, wherein:
            the cooling element comprises a body comprising a chamber connected to a channel configured to deliver gas to the chamber, and
            a roof of the chamber is disposed adjacent to the reticle and comprises openings configured to output the gas towards the reticle;
        actuators configured to modify a distance between the roof and the reticle; and
        a cooling controller configured to:
            generate a cooling control signal based on timing data for a projection of the patterned radiation beam, absorption data for the exposed area on the reticle, and a target heat transfer rate, wherein the cooling control signal is configured to instruct the reticle cooling apparatus to actuate the actuators to modify the distance between the roof and the reticle; and
            transmit the cooling control signal to the actuators.
2. The lithographic apparatus of clause 1, wherein the distance between the roof and the reticle is between about 50 micrometers and about 100 micrometers.
3. The lithographic apparatus of clause 1, wherein the cooling element is separated from the exposed area in a direction that corresponds to a scanning direction of the lithographic apparatus.
4. The lithographic apparatus of clause 1, wherein:
    the cooling element is a first cooling element;
    the reticle cooling apparatus comprises a pair of cooling elements comprising the first cooling element and a second cooling element; and
    the pair of cooling elements is provided at opposite sides of the exposed area.
5. The lithographic apparatus of clause 4, wherein:
    the lithographic apparatus comprises a scanning lithographic apparatus configured to form a curved exposed area; and
    the pair of cooling elements are curved.
6. The lithographic apparatus of clause 5, wherein the first cooling element comprises a concave leading edge corresponding to the curved exposed area.
7. The lithographic apparatus of clause 5, wherein the first cooling element comprises a convex leading edge corresponding to a reflection of the curved exposed area.
8. The lithographic apparatus of clause 5, wherein the first cooling element comprises a roof member that is curved transverse to a scanning direction of the scanning lithographic apparatus such that outer ends of the roof member are closer to the reticle than a central portion of the roof member.
9. The lithographic apparatus of clause 5, wherein:
    the roof of the chamber of the body of the cooling element is a first roof of a first chamber of a first body of the first cooling element;
    the openings include a first set of openings defined by the first roof;
    a density of the first set of openings varies along a direction transverse to a scanning direction of the scanning lithographic apparatus; and
    the density of the first set of openings is higher at outer ends of the first roof than in a central portion of the first roof.
10. The lithographic apparatus of clause 1, wherein the cooling element further comprises an open cavity provided in an uppermost face of the body with respect to the reticle.
11. The lithographic apparatus of clause 1, wherein the openings comprise a row of apertures or an array of apertures.
12. The lithographic apparatus of clause 11, wherein the body further comprises at least one movable shutter configured to selectively close at least a subset of the row of apertures or the array of apertures.
13. The lithographic apparatus of clause 1, further comprising:
    a thermal shield located between a portion of the cooling element and the reticle,
    wherein the thermal shield is configured to reduce an amount of the heat that is removed from the reticle by the portion of the cooling element.
14. The lithographic apparatus of clause 1, wherein:
    the channel is a first channel;
    the reticle cooling apparatus further comprises a valve configured to selectively restrict a flow of the gas within the first channel;
    the valve defines a second channel between a fluid ingress connected to the first channel and a fluid egress;
    the valve comprises a housing portion and a sliding member;
    the sliding member is slidable between a first position in which the second channel is unrestricted and a second position in which the second channel is partially restricted; and
    the sliding member is configured not to physically contact the housing portion.
15. The lithographic apparatus of clause 1, wherein the body is bendable so as to control cooling provided by a portion of the gas disposed between the cooling element and the reticle.
16. The lithographic apparatus of clause 1, further comprising a reticle temperature adjustment system configured to adjust a first temperature of the reticle to a second temperature above the first temperature before the reticle is placed on the reticle table.
17. The lithographic apparatus of clause 1, further comprising:
    a heating apparatus configured to heat the reticle, wherein:

the heating apparatus comprises a pair of heating elements comprising a first heating element and a second heating element; and the pair of heating elements is configured to heat reticle areas located at opposite ends of the exposed area in a non-scanning direction of the lithographic apparatus.

18. The lithographic apparatus of clause 1, wherein the cooling element is in thermal communication with the reticle.

19. A reticle cooling apparatus comprising:

a cooling element configured to be disposed below a reticle supported by a reticle table and adjacent to an exposed area of the reticle, wherein:

the cooling element comprises a body containing a chamber connected to a channel configured to deliver gas to the chamber, and a roof of the chamber is configured to be disposed adjacent to the reticle and comprises openings configured to output the gas towards the reticle;

actuators configured to modify a distance between the roof and the reticle; and a cooling controller configured to:

generate a cooling control signal based on timing data for a projection of a patterned radiation beam generated by the reticle, absorption data for the exposed area on the reticle, and a target heat transfer rate, wherein the cooling control signal is configured to instruct the reticle cooling apparatus to actuate the actuators to modify the distance between the roof and the reticle; and transmit the cooling control signal to the actuators.

20. A method comprising:

generating, by a cooling controller, a cooling control signal based on timing data for a projection of a patterned radiation beam formed by illuminating an exposed area on a reticle supported by a reticle table, absorption data for the exposed area, and a target heat transfer rate, wherein the cooling control signal instructs a reticle cooling apparatus to actuate actuators to modify a distance between the reticle and a roof of a chamber connected to a channel for delivering gas to the chamber, the channel being in a body of a cooling element of the reticle cooling apparatus;

transmitting, by the cooling controller, the cooling control signal to the actuators; and modifying, by the actuators based on the cooling control signal, the distance between the reticle and the roof to modify a heat transfer rate associated with a removal of heat from the reticle towards the target heat transfer rate.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A lithographic apparatus, comprising:

an optical system configured to direct a radiation beam onto a reticle supported by a reticle table to form a patterned radiation beam, wherein the radiation beam causes heating of an exposed area of the reticle; and a reticle cooling apparatus configured to remove heat from the reticle, wherein the reticle cooling apparatus comprises:

a cooling element disposed below the reticle and adjacent to the exposed area, wherein:

the cooling element comprises a body comprising a chamber connected to a channel configured to deliver gas to the chamber, and a roof of the chamber is disposed adjacent to the reticle and comprises openings configured to output the gas towards the reticle;

actuators configured to modify a distance between the roof and the reticle; and a cooling controller configured to:
generate a cooling control signal based on timing data for a projection of the patterned radiation beam, absorption data for the exposed area on the reticle, and a target heat transfer rate, wherein the cooling control signal is configured to instruct the reticle cooling apparatus to actuate the actuators to modify the distance between the roof and the reticle; and transmit the cooling control signal to the actuators.

2. The lithographic apparatus of claim 1, wherein the distance between the roof and the reticle is between about 50 micrometers and about 100 micrometers and the cooling element is separated from the exposed area in a direction that corresponds to a scanning direction of the lithographic apparatus.

3. The lithographic apparatus of claim 1, wherein:
the cooling element is a first cooling element;
the reticle cooling apparatus comprises a pair of cooling elements comprising the first cooling element and a second cooling element;
the pair of cooling elements is provided at opposite sides of the exposed area;
the lithographic apparatus comprises a scanning lithographic apparatus configured to form a curved exposed area; and
the pair of cooling elements are curved.

4. The lithographic apparatus of claim 3, wherein the first cooling element comprises a concave leading edge corresponding to the curved exposed area.

5. The lithographic apparatus of claim 3, wherein the first cooling element comprises a convex leading edge corresponding to a reflection of the curved exposed area.

6. The lithographic apparatus of claim 3, wherein the first cooling element comprises a roof member that is curved transverse to a scanning direction of the scanning lithographic apparatus such that outer ends of the roof member are closer to the reticle than a central portion of the roof member.

7. The lithographic apparatus of claim 3, wherein:
the roof of the chamber of the body of the cooling element is a first roof of a first chamber of a first body of the first cooling element;
the openings include a first set of openings defined by the first roof;
a density of the first set of openings varies along a direction transverse to a scanning direction of the scanning lithographic apparatus; and
the density of the first set of openings is higher at outer ends of the first roof than in a central portion of the first roof.

8. The lithographic apparatus of claim 1, wherein the cooling element further comprises an open cavity provided in an uppermost face of the body with respect to the reticle.

9. The lithographic apparatus of claim 1, wherein:
the openings comprise a row of apertures or an array of apertures; and
the body further comprises at least one movable shutter configured to selectively close at least a subset of the row of apertures or the array of apertures.

10. The lithographic apparatus of claim 1, further comprising:

a thermal shield located between a portion of the cooling element and the reticle,
wherein the thermal shield is configured to reduce an amount of the heat that is removed from the reticle by the portion of the cooling element.

11. The lithographic apparatus of claim 1, wherein:
the channel is a first channel;
the reticle cooling apparatus further comprises a valve configured to selectively restrict a flow of the gas within the first channel;
the valve defines a second channel between a fluid ingress connected to the first channel and a fluid egress;
the valve comprises a housing portion and a sliding member;
the sliding member is slidable between a first position in which the second channel is unrestricted and a second position in which the second channel is partially restricted; and
the sliding member is configured not to physically contact the housing portion.

12. The lithographic apparatus of claim 1, further comprising a reticle temperature adjustment system configured to adjust a first temperature of the reticle to a second temperature above the first temperature before the reticle is placed on the reticle table, wherein the body is bendable so as to control cooling provided by a portion of the gas disposed between the cooling element and the reticle.

13. The lithographic apparatus of claim 1, further comprising:
a heating apparatus configured to heat the reticle, wherein:
the heating apparatus comprises a pair of heating elements comprising a first heating element and a second heating element; and
the pair of heating elements is configured to heat reticle areas located at opposite ends of the exposed area in a non-scanning direction of the lithographic apparatus,
wherein the cooling element is in thermal communication with the reticle.

14. A reticle cooling apparatus comprising:
a cooling element configured to be disposed below a reticle supported by a reticle table and adjacent to an exposed area of the reticle, wherein:
the cooling element comprises a body containing a chamber connected to a channel configured to deliver gas to the chamber, and
a roof of the chamber is configured to be disposed adjacent to the reticle and comprises openings configured to output the gas towards the reticle;
actuators configured to modify a distance between the roof and the reticle; and
a cooling controller configured to:
generate a cooling control signal based on timing data for a projection of a patterned radiation beam generated by the reticle, absorption data for the exposed area on the reticle, and a target heat transfer rate, wherein the cooling control signal is configured to instruct the reticle cooling apparatus to actuate the actuators to modify the distance between the roof and the reticle; and
transmit the cooling control signal to the actuators.

15. A method comprising:
generating, by a cooling controller, a cooling control signal based on timing data for a projection of a patterned radiation beam formed by illuminating an exposed area on a reticle supported by a reticle table, absorption data for the exposed area, and a target heat transfer rate, wherein the cooling control signal instructs a reticle cooling apparatus to actuate actuators to modify a distance between the reticle and a roof of a chamber connected to a channel for delivering gas to the chamber, the channel being in a body of a cooling element of the reticle cooling apparatus;

transmitting, by the cooling controller, the cooling control signal to the actuators; and modifying, by the actuators based on the cooling control signal, the distance between the reticle and the roof to modify a heat transfer rate associated with a removal of heat from the reticle towards the target heat transfer rate.

* * * * *